United States Patent
Kanarik

(10) Patent No.: US 11,239,094 B2
(45) Date of Patent: *Feb. 1, 2022

(54) DESIGNER ATOMIC LAYER ETCHING

(71) Applicant: Lam Research Corporation, Fremont, CA (US)

(72) Inventor: Keren Jacobs Kanarik, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/717,385

(22) Filed: Dec. 17, 2019

(65) Prior Publication Data
US 2020/0118835 A1   Apr. 16, 2020

Related U.S. Application Data

(63) Continuation of application No. 15/841,205, filed on Dec. 13, 2017, now Pat. No. 10,566,212.
(Continued)

(51) Int. Cl.
*H01L 21/321*   (2006.01)
*H01L 21/3213*   (2006.01)
(Continued)

(52) U.S. Cl.
CPC .. *H01L 21/32136* (2013.01); *H01J 37/32715* (2013.01); *H01J 37/32724* (2013.01);
(Continued)

(58) Field of Classification Search
CPC ......... H01L 21/32136; H01L 21/67069; H01L 21/67103; H01L 21/6831; H01L 21/30621;
(Continued)

(56) References Cited

U.S. PATENT DOCUMENTS

| | | |
|---|---|---|
| 4,592,801 A | 6/1986 | Hara et al. |
| 4,756,794 A | 7/1988 | Yoder |
| | (Continued) | |

FOREIGN PATENT DOCUMENTS

| | | |
|---|---|---|
| CN | 1550575 A | 12/2004 |
| CN | 1552097 A | 12/2004 |
| | (Continued) | |

OTHER PUBLICATIONS

U.S. Office Action dated Apr. 10, 2019 issued in U.S. Appl. No. 15/841,205.
(Continued)

*Primary Examiner* — Duy Vu N Deo
(74) *Attorney, Agent, or Firm* — Weaver Austin Villeneuve & Sampson LLP

(57) ABSTRACT

Methods for evaluating synergy of modification and removal operations for a wide variety of materials to determine process conditions for self-limiting etching by atomic layer etching are provided herein. Methods include determining the surface binding energy of the material, selecting a modification gas for the material where process conditions for modifying a surface of the material generate energy less than the modification energy and greater than the desorption energy, selecting a removal gas where process conditions for removing the modified surface generate energy greater than the desorption energy to remove the modified surface but less than the surface binding energy of the material to prevent sputtering, and calculating synergy to maximize the process window for atomic layer etching.

11 Claims, 10 Drawing Sheets

Related U.S. Application Data

(60) Provisional application No. 62/532,916, filed on Jul. 14, 2017, provisional application No. 62/436,286, filed on Dec. 19, 2016.

(51) Int. Cl.

| | |
|---|---|
| *H01L 21/02* | (2006.01) |
| *H01L 21/311* | (2006.01) |
| *H01L 21/3065* | (2006.01) |
| *H01L 21/67* | (2006.01) |
| *H01L 21/306* | (2006.01) |
| *H01J 37/32* | (2006.01) |
| *H01L 21/683* | (2006.01) |

(52) U.S. Cl.
CPC .... *H01L 21/0228* (2013.01); *H01L 21/02274* (2013.01); *H01L 21/3065* (2013.01); *H01L 21/30621* (2013.01); *H01L 21/31116* (2013.01); *H01L 21/31122* (2013.01); *H01L 21/32138* (2013.01); *H01L 21/67063* (2013.01); *H01L 21/67069* (2013.01); *H01L 21/67103* (2013.01); *H01L 21/67207* (2013.01); *H01L 21/67259* (2013.01); *H01L 21/6831* (2013.01); *H01J 2237/2001* (2013.01); *H01J 2237/3341* (2013.01)

(58) Field of Classification Search
CPC ......... H01L 21/31122; H01L 21/67259; H01L 21/67207; H01L 21/31116; H01L 21/32138; H01L 21/0228; H01L 21/02274; H01L 21/67063; H01L 21/3065; H01J 37/32724; H01J 37/32715; H01J 2237/3341; H01J 2237/2001
See application file for complete search history.

(56) References Cited

U.S. PATENT DOCUMENTS

| | | |
|---|---|---|
| 5,411,631 A | 5/1995 | Hori et al. |
| 5,445,988 A | 8/1995 | Schwalke |
| 5,482,802 A | 1/1996 | Celler et al. |
| 5,527,425 A | 6/1996 | Hobson et al. |
| 5,789,265 A | 8/1998 | Nitta et al. |
| 5,814,239 A | 9/1998 | Kaneko et al. |
| 6,022,806 A | 2/2000 | Sato et al. |
| 6,083,413 A | 7/2000 | Sawub et al. |
| 6,177,353 B1 | 1/2001 | Gutsche et al. |
| 6,482,745 B1 | 11/2002 | Hwang |
| 6,562,700 B1 | 5/2003 | Gu et al. |
| 6,635,965 B1 | 10/2003 | Lee et al. |
| 6,844,258 B1 | 1/2005 | Fair et al. |
| 6,933,242 B1 | 8/2005 | Srinivasan et al. |
| 7,005,372 B2 | 2/2006 | Levy et al. |
| 7,115,522 B2 | 10/2006 | Tomioka et al. |
| 7,141,494 B2 | 11/2006 | Lee et al. |
| 7,196,955 B2 | 3/2007 | Nickel |
| 7,416,989 B1 | 8/2008 | Liu et al. |
| 7,589,017 B2 | 9/2009 | Chan et al. |
| 7,759,239 B1 | 7/2010 | Lin et al. |
| 7,772,114 B2 | 8/2010 | Chan et al. |
| 7,795,148 B2 | 9/2010 | Brown |
| 7,955,972 B2 | 6/2011 | Chan et al. |
| 8,048,805 B2 | 11/2011 | Chan et al. |
| 8,058,170 B2 | 11/2011 | Chandrashekar et al. |
| 8,124,505 B1 | 2/2012 | Burnham et al. |
| 8,124,531 B2 | 2/2012 | Chandrashekar et al. |
| 8,252,194 B2 | 8/2012 | Kiehlbauch et al. |
| 8,551,885 B2 | 10/2013 | Chen et al. |
| 8,617,411 B2 | 12/2013 | Singh |
| 8,808,561 B2 | 8/2014 | Kanarik |
| 8,883,028 B2 | 11/2014 | Kanarik |
| 8,993,352 B2 | 3/2015 | Nishimura et al. |
| 9,130,158 B1 | 9/2015 | Shen et al. |
| 9,230,818 B2 | 1/2016 | Moustakas et al. |
| 9,257,638 B2 | 2/2016 | Tan et al. |
| 9,362,163 B2 | 6/2016 | Danek et al. |
| 9,378,970 B2 | 6/2016 | Joubert et al. |
| 9,449,843 B1 | 9/2016 | Korolik et al. |
| 9,520,821 B1 | 12/2016 | Sheahan |
| 9,570,317 B2 | 2/2017 | Posseme et al. |
| 9,570,600 B2 | 2/2017 | Lu et al. |
| 9,576,811 B2 | 2/2017 | Kanarik et al. |
| 9,647,206 B2 | 5/2017 | Hashimoto et al. |
| 9,768,033 B2 | 9/2017 | Ranjan et al. |
| 9,805,941 B2 | 10/2017 | Kanarik et al. |
| 9,806,252 B2 | 10/2017 | Tan et al. |
| 9,837,312 B1 | 12/2017 | Tan et al. |
| 9,870,899 B2 | 1/2018 | Yang et al. |
| 9,972,504 B2 | 5/2018 | Lai et al. |
| 9,991,128 B2 | 6/2018 | Tan et al. |
| 9,997,371 B1 | 6/2018 | Agarwal et al. |
| 10,056,264 B2 | 8/2018 | Yang et al. |
| 10,096,487 B2 | 10/2018 | Yang et al. |
| 10,269,566 B2 | 4/2019 | Tan et al. |
| 10,374,144 B2 | 8/2019 | Tan et al. |
| 10,494,715 B2 | 12/2019 | Agarwal et al. |
| 10,566,212 B2 * | 2/2020 | Kanarik ............ H01J 37/32715 |
| 10,566,213 B2 * | 2/2020 | Kanarik ............ H01L 21/31116 |
| 10,685,836 B2 | 6/2020 | Tan et al. |
| 10,749,103 B2 | 8/2020 | Tan et al. |
| 10,784,086 B2 | 9/2020 | Yang et al. |
| 10,796,912 B2 | 10/2020 | Shamma et al. |
| 10,832,909 B2 | 11/2020 | LaVoie et al. |
| 2001/0024769 A1 | 9/2001 | Donoghue et al. |
| 2001/0053585 A1 | 12/2001 | Kikuchi et al. |
| 2002/0009883 A1 | 1/2002 | Ogure et al. |
| 2002/0051728 A1 | 5/2002 | Sato et al. |
| 2002/0058409 A1 | 5/2002 | Lin et al. |
| 2003/0015704 A1 | 1/2003 | Curless |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0006222 A1 | 1/2005 | Ding et al. |
| 2005/0061234 A1 | 3/2005 | Li et al. |
| 2005/0098440 A1 | 5/2005 | Kailasam et al. |
| 2005/0167399 A1 | 8/2005 | Ludviksson et al. |
| 2005/0208754 A1 | 9/2005 | Kostamo et al. |
| 2006/0009040 A1 | 1/2006 | Tomioka et al. |
| 2006/0051959 A1 | 3/2006 | Iwatake et al. |
| 2006/0169669 A1 | 8/2006 | Zojaji et al. |
| 2006/0172530 A1 | 8/2006 | Cheng et al. |
| 2006/0194435 A1 | 8/2006 | Nishimura et al. |
| 2007/0049036 A1 | 3/2007 | Huang |
| 2007/0095367 A1 | 5/2007 | Wang et al. |
| 2007/0117040 A1 | 5/2007 | Brock et al. |
| 2007/0202254 A1 | 8/2007 | Ganguli et al. |
| 2007/0212889 A1 | 9/2007 | Abatchev et al. |
| 2007/0238301 A1 | 10/2007 | Cabral et al. |
| 2007/0246442 A1 | 10/2007 | America et al. |
| 2009/0020884 A1 | 1/2009 | Lee et al. |
| 2009/0075472 A1 | 3/2009 | Arnold et al. |
| 2009/0226611 A1 | 9/2009 | Suzuki et al. |
| 2009/0236693 A1 | 9/2009 | Moustakas et al. |
| 2009/0256220 A1 | 10/2009 | Horng et al. |
| 2009/0286402 A1 | 11/2009 | Xia et al. |
| 2009/0289263 A1 | 11/2009 | Duong et al. |
| 2010/0060539 A1 | 3/2010 | Suetsuna et al. |
| 2010/0291751 A1 | 11/2010 | Lee et al. |
| 2010/0297847 A1 | 11/2010 | Cheng et al. |
| 2011/0117678 A1 | 5/2011 | Varadarajan et al. |
| 2011/0130011 A1 | 6/2011 | Sasajima et al. |
| 2011/0139748 A1 | 6/2011 | Donnelly et al. |
| 2011/0151635 A1 | 6/2011 | Liu et al. |
| 2011/0192820 A1 | 8/2011 | Yeom et al. |
| 2011/0212274 A1 | 9/2011 | Selsley |
| 2011/0244688 A1 | 10/2011 | Ohsawa et al. |
| 2012/0009785 A1 | 1/2012 | Chandrashekar et al. |
| 2012/0077349 A1 | 3/2012 | Li et al. |
| 2012/0100308 A1 | 4/2012 | Milligan et al. |
| 2012/0115329 A1 | 5/2012 | Chandrashekar et al. |
| 2012/0276657 A1 | 11/2012 | Joubert et al. |

(56) References Cited

U.S. PATENT DOCUMENTS

| | | |
|---|---|---|
| 2013/0023125 A1 | 1/2013 | Singh |
| 2013/0099277 A1 | 4/2013 | Speck et al. |
| 2013/0105303 A1 | 5/2013 | Lubomirsky et al. |
| 2013/0115763 A1 | 5/2013 | Takemure et al. |
| 2013/0168354 A1 | 7/2013 | Kanarik |
| 2013/0200391 A1 | 8/2013 | Bedair et al. |
| 2013/0313561 A1 | 11/2013 | Suh |
| 2014/0061861 A1 | 3/2014 | Moustakas et al. |
| 2014/0120688 A1 | 5/2014 | Booth, Jr. et al. |
| 2014/0134847 A1 | 5/2014 | Seya |
| 2014/0170853 A1 | 6/2014 | Shamma et al. |
| 2014/0175617 A1 | 6/2014 | Antonelli et al. |
| 2014/0178568 A1 | 6/2014 | Wolff et al. |
| 2014/0193580 A1 | 7/2014 | Tiron et al. |
| 2014/0239462 A1 | 8/2014 | Shamma et al. |
| 2014/0335666 A1 | 11/2014 | Koehler et al. |
| 2015/0017812 A1 | 1/2015 | Chandrasekharan et al. |
| 2015/0037972 A1 | 2/2015 | Danek et al. |
| 2015/0041809 A1 | 2/2015 | Arnold et al. |
| 2015/0064917 A1 | 3/2015 | Somervell et al. |
| 2015/0084156 A1 | 3/2015 | Ravasio et al. |
| 2015/0170957 A1 | 6/2015 | Tsao |
| 2015/0214474 A1 | 7/2015 | Nishimura et al. |
| 2015/0228495 A1 | 8/2015 | Joubert et al. |
| 2015/0243883 A1 | 8/2015 | Swaminathan et al. |
| 2015/0270140 A1 | 9/2015 | Gupta et al. |
| 2015/0345029 A1 | 12/2015 | Wang et al. |
| 2016/0013063 A1 | 1/2016 | Ranjan et al. |
| 2016/0020152 A1 | 1/2016 | Posseme |
| 2016/0064244 A1 | 3/2016 | Agarwal et al. |
| 2016/0118246 A1 | 4/2016 | Kang et al. |
| 2016/0135274 A1 | 5/2016 | Fischer et al. |
| 2016/0203995 A1 | 7/2016 | Kanarik et al. |
| 2016/0293437 A1 | 10/2016 | Zhou et al. |
| 2016/0308112 A1 | 10/2016 | Tan et al. |
| 2016/0314985 A1 | 10/2016 | Yang et al. |
| 2016/0358782 A1 | 12/2016 | Yang et al. |
| 2016/0365248 A1 | 12/2016 | Mebarki et al. |
| 2016/0379824 A1 | 12/2016 | Wise et al. |
| 2017/0040214 A1 | 2/2017 | Lai et al. |
| 2017/0053810 A1 | 2/2017 | Yang et al. |
| 2017/0069462 A1 | 3/2017 | Kanarik et al. |
| 2017/0117159 A1 | 4/2017 | Kanarik et al. |
| 2017/0125256 A1 | 5/2017 | Lee et al. |
| 2017/0170036 A1 | 6/2017 | Fischer et al. |
| 2017/0178917 A1 | 6/2017 | Kamp et al. |
| 2017/0178920 A1 | 6/2017 | Dole et al. |
| 2017/0229311 A1 | 8/2017 | Tan et al. |
| 2017/0316935 A1 | 11/2017 | Tan et al. |
| 2018/0019387 A1 | 1/2018 | Tan et al. |
| 2018/0033635 A1 | 2/2018 | Kanarik et al. |
| 2018/0102236 A1 | 4/2018 | Yang et al. |
| 2018/0174860 A1 | 6/2018 | Kanarik |
| 2018/0240682 A1 | 8/2018 | Lai et al. |
| 2018/0308695 A1 | 10/2018 | LaVoie et al. |
| 2018/0312973 A1 | 11/2018 | Agarwal et al. |
| 2018/0337046 A1 | 11/2018 | Shamma et al. |
| 2018/0350624 A1 | 12/2018 | Kanarik et al. |
| 2019/0244805 A1 | 8/2019 | Tan et al. |
| 2019/0312194 A1 | 10/2019 | Tan et al. |
| 2020/0118835 A1 | 4/2020 | Kanarik |
| 2020/0286743 A1 | 9/2020 | Lai et al. |
| 2020/0402801 A1 | 12/2020 | Shamma et al. |
| 2021/0005425 A1 | 1/2021 | Yang et al. |

FOREIGN PATENT DOCUMENTS

| | | | |
|---|---|---|---|
| CN | 1568376 | A | 1/2005 |
| CN | 101015047 | A | 8/2007 |
| CN | 101351869 | A | 1/2009 |
| CN | 101388359 | A | 3/2009 |
| CN | 101631894 | A | 1/2010 |
| CN | 102934208 | A | 2/2013 |
| CN | 103748658 | A | 4/2014 |
| CN | 104040021 | A | 9/2014 |
| CN | 104651893 | A | 5/2015 |
| CN | 105308723 | A | 2/2016 |
| CN | 105390437 | A | 3/2016 |
| CN | 105789027 | A | 7/2016 |
| EP | 0987745 | A1 | 3/2000 |
| EP | 1469511 | A2 | 10/2004 |
| JP | 06-326060 | A | 11/1994 |
| JP | 2000-323483 | A | 11/2000 |
| JP | 2002-510146 | A | 4/2002 |
| JP | 2002-537645 | A | 11/2002 |
| JP | 2004-349687 | A | 12/2004 |
| JP | 2015-002312 | A | 1/2015 |
| JP | 2016-532311 | A | 10/2016 |
| KR | 2011-0098683 | A | 9/2011 |
| KR | 2012-0005992 | A | 1/2012 |
| KR | 2014-0051962 | A | 5/2014 |
| KR | 2014-0116453 | A | 10/2014 |
| KR | 10-2016-0136303 | | 11/2016 |
| TW | 201027595 | A | 7/2010 |
| TW | 201140687 | A | 11/2011 |
| TW | I430334 | B | 3/2014 |
| WO | WO 9936956 | A1 | 7/1999 |
| WO | WO 0049202 | A2 | 8/2000 |
| WO | WO 02/091461 | A2 | 11/2002 |
| WO | WO 03/031674 | A1 | 4/2003 |
| WO | WO 2011/081921 | A2 | 7/2011 |
| WO | WO 2016/100873 | A1 | 6/2016 |
| WO | WO 2017/099718 | A1 | 6/2017 |

OTHER PUBLICATIONS

U.S. Final Office Action dated Sep. 16, 2019 issued in U.S. Appl. No. 15/841,205.
U.S. Notice of Allowance dated Dec. 2, 2019 issued in U.S. Appl. No. 15/841,205.
U.S. Office Action dated Sep. 6, 2019 issued in U.S. Appl. No. 16/049,320.
U.S. Notice of Allowance dated Dec. 2, 2019 issued in U.S. Appl. No. 16/049,320.
U.S. Office Action dated Nov. 6, 2019 issued in U.S. Appl. No. 15/979,340.
U.S. Notice of Allowance dated Jun. 10, 2020 issued in U.S. Appl. No. 15/979,340.
U.S. Office Action dated Dec. 30, 2019 issued in U.S. Appl. No. 15/955,099.
U.S. Notice of Allwance dated Jul. 14, 2020 issued in U.S. Appl. No. 15/955,099.
Chinese First Office Action dated Aug. 28, 2019 issued in Application No. CN 201710066218.0.
Taiwanese First Office Action dated Jul. 23, 2020 issued in Application No. TW 106103603.
International Preliminary Report on Patentability dated Nov. 28, 2019 issued in Application No. PCT/US2018/032783.
Kanarik et al. (Nov. 2016) "Tech Brief: All About ALE" [webpage] pp. 1-3. <URL:https://blog.lamresearch.com/tech-brief-all-about-ale/>.
U.S. Final Office Action dated Mar. 5, 2020 issued in U.S. Appl. No. 15/824,987.
U.S. Notice of Allowance dated May 11, 2020 issued in U.S. Appl. No. 15/824,987.
U.S. Final Office Action dated Jan. 3, 2020 issued in U.S. Appl. No. 15/954,509.
U.S. Office Action dated Dec. 10, 2020 issued in U.S. Appl. No. 15/929,854.
Taiwanese Notice of Allowance dated Dec. 27, 2019 issued in Application No. TW 105112529.
Japanese First Office Action dated Jun. 2, 2020 issued in Application No. JP 2016-082061.
Chinese Second Office Action dated Apr. 22, 2019 issued in CN CN 201610643282.6.
Chinese Notification of Reexamination dated Jun. 15, 2020 issued in CN 201610643282.6.
Taiwanese First Office Action dated Mar. 17, 2020 issued in TW 105124539.

(56) References Cited

OTHER PUBLICATIONS

Korean First Office Action dated Nov. 29, 2020 issued in KR 10-2016-0099470.
Chinese Third Office Action dated Dec. 20, 2019 issued in CN 201610694927.9.
Chinese Fourth Office Action dated Sep. 8, 2020 issued in CN 201610694927.9.
Singapore Notice of Eligibility for Grant and Supplementary Examination Report dated Jan. 9, 2020.
Taiwanese First Office Action dated Jul. 23, 2020 issued in TW 106103603.
Chinese First Office Action dated Apr. 3, 2020 issued in CN 201710604639.4.
International Search Report and Written Opinion dated Jun. 28, 2019 issued in Application No. PCT/US2019/022520.
International Preliminary Report on Patentability dated Oct. 15, 2020 issued in Application No. PCT/US2019/022520.
Korean First Office Action dated Jan. 13, 2021 issued in Application No. KR 10-2014-0097663.
Taiwanese First Office Action dated Jan. 7, 2020 issued in Application No. TW 105117488.
Taiwanese Second Office Action dated Jun. 23, 2020 issued in Application No. TW 105117488.
U.S. Office Action dated Sep. 19, 2019 issued in U.S. Appl. No. 15/824,987.
Chinese Third Office Action dated Sep. 27, 2019 issued in CN 201610643282.6.
Chinese Third Office Action dated Sep. 3, 2019 issued in CN 201610393976.9.
U.S. Office Action dated Nov. 29, 2017 issued in U.S. Appl. No. 15/421,189.
U.S. Notice of Allowance dated Apr. 25, 2018 issued in U.S. Appl. No. 15/421,189.
U.S. Office Action dated Apr. 19, 2018 issued in U.S. Appl. No. 15/494,245.
U.S. Notice of Allowance dated Dec. 13, 2018 issued in U.S. Appl. No. 15/494,245.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
U.S. Office Action dated Aug. 10, 2018 issued in U.S. Appl. No. 15/654,612.
U.S. Final Office Action dated Mar. 8, 2019 issued in U.S. Appl. No. 15/654,612.
U.S. Notice of Allowance dated Aug. 1, 2019 issued in U.S. Appl. No. 15/654,612.
International Search Report and Written Opinion dated Apr. 5, 2018 issued in Application No. PCT/US2017/066470.
International Preliminary Report on Patentability dated Jul. 4, 2019 issued in Application No. PCT/US2017/066470.
International Search Report and Written Opinion dated Nov. 26, 2018 issued in Application No. PCT/US18/42024.
International Search Report and Written Opinion dated Oct. 16, 2018 issued in Application No. PCT/US2018/032783.
Faraz et al., (2015) "Atomic Layer Etching: What Can We Learn from Atomic Layer Deposition?," *ECS Journal of Solid State Science and Technology*, 4(6):N5023-N5032.
Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.
Kanarik et al., (Mar./Apr. 2015) "Overview of atomic layer etching in the semiconductor industry," *J. Vac. Sci. Technol. A*, 33(2):020802-1-020802-14.
Kanarik et al., (Sep./Oct. 2017) "Predicting synergy in atomic layer etching," *J. Vac. Sci. Technol. A*,35(5):05C302-1 through 05C302-7.
U.S. Office Action dated May 5, 2016 issued in U.S. Appl. No. 14/749,285.
U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Dec. 14, 2018 issued in U.S. Appl. No. 15/719,497.
U.S. Notice of Allowance dated Mar. 22, 2019 issued in U.S. Appl. No. 15/719,497.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated Jul. 25, 2017 issued in U.S. Appl. No. 14/830,683.
U.S. Notice of Allowance dated Jan. 11, 2018 issued in U.S. Appl. No. 14/830,683.
U.S. Office Action dated May 1, 2019 issued in U.S. Appl. No. 15/954,509.
U.S. Office Action dated Aug. 25, 2017 issued in U.S. Appl. No. 15/239,138.
U.S. Notice of Allowance dated May 10, 2018 issued in U.S. Appl. No. 15/239,138.
U.S. Office Action dated Mar. 24, 2017 issued in U.S. Appl. No. 15/286,421.
U.S. Notice of Allowance dated Sep. 28, 2017 issued in U.S. Appl. No. 15/286,421.
U.S. Notice of Allowance [Supplemental] dated Oct. 26, 2017 issued in U.S. Appl. No. 15/286,421.
PCT International Search Report and Written Opinion dated Feb. 25, 2016 issued in PCT/US2015/066789 [2059487014WO].
Chinese First Office Action dated Jun. 26, 2018 issued in Application No. CN 201610255293.7.
Chinese Second Office Action dated Feb. 3, 2019 issued in Application No. CN 201610255293.7.
Singapore Search Report and Written Opinion dated Jul. 9, 2018 issued in Application No. SG 10201603092R.
Chinese First Office Action dated Mar. 30, 2018 issued in CN 201610248296.8.
Chinese Second Office Action dated Dec. 27, 2018 issued in CN 201610248296.8.
Singapore Search Report and Written Opinion dated Jun. 28, 2018 issued in SG 10201603090V.
Chinese First Office Action dated Aug. 28, 2018 issued in CN 201610643282.6.
Chinese First Office Action dated Jan. 9, 2019 issued in CN 201610694927.9.
Chinese Second Office Action dated Jun. 17, 2019 issued in CN 201610694927.9.
International Search Report and Written Opinon dated Apr. 5, 2018 issued in PCT/US2017/066470.
Boullart et al. (Mar. 29, 2013) "STT MRAM patterning challenges," *Proc. SPIE , Advanced Etch Technology for Nanopatterning II, Proc. of SPIE* 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," *ECS Journal of Solid State Science and Technology*,4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.

(56) References Cited

OTHER PUBLICATIONS

Jiang et al. (1998) "Complexes Containing Unbridged Dative Metal-Metal Bonds and the Strong Acceptor $Ru(Co)_3(SiCl_3)_2$ Moiety. Comments on the Transition Metal to Silicon Bond," *Organometallics*, 17(26):5810-5819.

Kanarik et al. (2017) "Predicting synergy in atomic layer etching," *J. Vac. Sci. Technol. A*,35(5):05C302-1 through 05C302-7.

Lee et al. (2015) "Atomic Layer Etching of $Al_2O_3$ Using Sequential, Self-Limiting Thermal Reactions with $Sn(acac)_2$ and Hydrogen Fluoride," $^{ACS}Nano$,9(2):2061-2070.

Pomeroy, R.K. and Wijesekera, K.S. (1980) "Preparation and derivatives of cis-$M(Co)_4(SiCl_3)_2$ (M = Fe, Ru, Os)," *Inorg. Chem.*, 19(12):3729-3735.

Schmitt et al. (2006) "Synthesis and Properties of Single-Crystal FeSi Nanowires," *Nano Lett.*, 6(8): 1617-1621.

Schmitt et al. (Feb. 1, 2008) "Chemical Synthesis and Magnetotransport of Magnetic Semiconducting $Fe_{1-x}Co_xSi$ Alloy Nanowires," *Nano Lett.*, 8(3):810-815.

Wolf, S. and Tauber, R.N. (1986) "Silicon Processing for the VLSI Era," *Volume 1—Process Technology, Lattice Press*, pp. 542-557.

U.S. Office Action dated Jul. 21, 2015 issued in U.S. Appl. No. 14/446,203.

U.S. Notice of Allowance dated Feb. 5, 2016 issued in U.S. Appl. No. 14/446,203.

U.S. Office Action dated May 23, 2017 issued in U.S. Appl. No. 15/173,358.

U.S. Notice of Allowance dated Jan. 29, 2018 issued in U.S. Appl. No. 15/173,358.

U.S. Notice of Allowance dated Apr. 10, 2018 issued in U.S. Appl. No. 15/173,358.

Taiwanese First Office Action dated Oct. 24, 2017 issued in TW 103126076.

Taiwanese Second Office Action dated Oct. 8, 2018 issued in TW 103126076.

Chinese First Office Action dated Jul. 23, 2018 issued in CN 201610393976.9.

Chinese Second Office Action dated Apr. 28, 2019 issued in CN 201610393976.9.

Carver et al., "Atomic Layer Etching: An Industry Perspective," ECS Journal of Solid State Science and Technology, vol. 4, No. 6, Feb. 20, 2015, pp. N5005-N5009.

DeSalvo, G. et al., (1996) "Controlled Digital Etching of GaAs for Precise Gate Recess Formation in MESFET, HEMT and pHEMT Device Fabrication," [http://csmantech.pairserver.com/newsite/gaasmantech/Digests/1996/papers/1996%202.2%20controlled%20digital%20etching%20gaas.pdf], pp. 29-31.

Higham, Eric, (2016) "The Compound Semiconductor Industry; How Did It Get Here and Where Is It Going?," *SemiCon WEST* Jul. 12-14, 2016 [http://www.semiconwest.org/sites/semiconwest.org/files/data15/docs/2_Eric%20Higham_Strategy%20Analytics.pdf], 27pp.

Kim, Jong Kyu, et al., (Nov./Dec. 2013) "Atomic layer etching removal of damaged layers in a contact hole for low sheet resistance," *Journal of Vacuum Science & Technology*, 31(6):8.

Metzler et al., (Mar./Apr. 2014) "Fluorocarbon assisted atomic layer etching of SiO2 using cyclic Ar/C4F8 plasma," *Journal of Vacuum Science & Technology A*, 32(2):5.

Oehrlein, Gottlieb S., "Atomic Layer Etching of $SiO_2$: Challenges And Opportunities*," *University of Maryland, Atomic Layer Etch and Atomic Layer Clean Technology Workshop*, San Francisco, Apr. 21, 2014, 22 pages.

Volatier, M., et al., "Extremely high aspect ratio GaAs and GaAs/AlGaAs nanowaveguides fabricated using chlorine ICP etching with N2-promoted passivation," Nanotechnology, vol. 21, Mar. 8, 2010, pp. 1-8. <doi:10.1088/0957-4484/21/13/134014>.

U.S. Appl. No. 16/449,141, filed Jun. 21, 2019, Tan et al.

U.S. Office Action dated Mar. 18, 2021 issued in U.S. Appl. No. 17/008,095.

Stulen, et al., "Extreme Ultraviolet Lithography" IEEE Journal of Quantum Electronics (May 1999) pp. 694-699.

Rothschild, et al., "Liquid immersion lithography: Why, how, and when?" Journal Vacuum Science Technology, Nov./Dec. 2004. (Year: 2004) pp. 2877-2881.

Wang, et al., "Lithography Simulation for the Fabrication of Silicon Photonic Devices with Deep-Ultraviolet Lithography" IEEE, (2012) pp. 288-290.

U.S. Notice of Allowance dated Mar. 19, 2021 issued in U.S. Appl. No. 15/929,854.

Japanese Second Office Action dated Jan. 21, 2021 issued in Application No. JP 2016-082061.

Chinese Reexamination Decision dated Jan. 22, 2021 issued in CN 201610643282.6.

Taiwanese Second Office Action dated Feb. 25, 2021 issued in TW 105124539.

Chinese Reexamination Decision dated Mar. 2, 2021 issued in CN 201610694927.9.

Taiwanese First Office Action at Re-exam dated May 13, 2021 issued in Application No. TW 105117488.

\* cited by examiner

DESIGNER ATOMIC LAYER ETCHING

CROSS-REFERENCE TO RELATED APPLICATION

This application is a continuation of U.S. patent application Ser. No. 15/841,205, filed Dec. 13, 2017, and titled "DESIGNER ATOMIC LAYER ETCHING," which claims benefit of U.S. Provisional Patent Application No. 62/436,286, filed Dec. 19, 2016, and titled "DESIGNER ATOMIC LAYER ETCHING," and U.S. Provisional Patent Application No. 62/532,916, filed Jul. 14, 2017, and titled "DESIGNER ATOMIC LAYER ETCHING," which are incorporated by reference herein in their entireties and for all purposes.

BACKGROUND

Semiconductor fabrication processes include etching of various materials. As feature sizes shrink, there is a growing need for atomic scale processing such as Atomic Layer Etch (ALE). However, performing ALE in a self-limiting manner without sputtering for a variety of materials is challenging.

SUMMARY

Methods and apparatuses for processing semiconductor substrates are described herein. One aspect involves a method of etching a material on a substrate, the method including: identifying process conditions for an atomic layer etching process of the material using a modification gas and a removal gas; and performing the atomic layer etching process on the material on the substrate by: exposing the substrate to the modification gas to modify a surface of the material, the modification gas having a modification energy and a desorption energy with respect to the material to be etched, and exposing the modified surface to the removal gas and igniting a plasma to remove the modified surface, whereby the modification energy is less than the desorption energy, and the desorption energy is less than a surface binding energy of the material.

In various embodiments, identifying the process conditions includes selecting a substrate temperature for performing the exposing the substrate to the modification gas, such that the energy provided by the substrate temperature is between the modification energy and the desorption energy.

In various embodiments, identifying the process conditions includes selecting a bias power for applying a bias during the exposing the modified surface to the removal gas, such that the energy provided by the bias is between the desorption energy and the surface binding energy.

In various embodiments, the modification gas is selected to adsorb to the material without etching the material.

In various embodiments, the removal gas is selected to remove the modified surface without etching underlying unmodified material.

In some embodiments, the process conditions may be any one or more of: temperature, chamber pressure, plasma power, bias power, modification gas flow, and exposure time.

The method may also include modifying the process conditions within a process window. The process window may be defined by a minimum and maximum bias power delivered to a pedestal holding the substrate such that the minimum bias power is the minimum used to remove the modified surface and the maximum bias power is the highest bias that can be used without sputtering the material underlying the modified surface.

In various embodiments, the material is any one of silicon, carbon, tungsten, and tantalum. In some embodiments, the method also includes cooling the substrate to a temperature less than about 0° C. prior to performing the atomic layer etching process, whereby the process condition identified is temperature, and whereby the material is tantalum.

In various embodiments, the substrate is exposed to the modification gas at a substrate temperature less than about 0° C. In some embodiments, the temperature is between about −20° C. and about 0° C.

In some embodiments, the modification gas is a halogen-containing gas. In some embodiments, the removal gas is an inert gas.

In various embodiments, the atomic layer etching also includes purging a chamber housing the substrate between the exposing the substrate to the modification gas and the exposing the substrate to the removal gas.

Another aspect involves a method of etching tantalum on a substrate, the method including: providing the substrate including tantalum; cooling the substrate to a temperature less than about 0° C.; and performing atomic layer etching of the tantalum by: exposing the substrate to a modification gas to modify a surface of the tantalum, and exposing the modified surface to a removal gas and igniting a plasma to remove the modified surface of the tantalum.

In various embodiments, the substrate is exposed to the modification gas at a substrate temperature less than about 0° C. In some embodiments, the temperature is between about −20° C. and about 0° C.

In various embodiments, the substrate includes tantalum nitride. In some embodiments, the method also includes purging a chamber housing the substrate between the exposing the substrate to the modification gas and the exposing the substrate to the removal gas. Purging can be done using any inert gas such as $N_2$, Ar, Ne, He, and their combinations.

In some embodiments, the modification gas is chlorine. In some embodiments, the modification gas is any one or more of bromine, iodine, sulfur hexafluoride, silicon tetrafluoride, and boron trichloride ($BCl_3$).

In various embodiments, the removal gas is argon. In some embodiments, neon or krypton may be used. In a removal operation, the substrate may be exposed to an energy source (e.g. activating or ion bombardment gas or chemically reactive species that induces removal), such as argon or helium, to etch the substrate by providing enough energy to desorb the modified tantalum surface but insufficient to sputter the tantalum such that energy is less than the surface binding energy. In some embodiments, removal may be isotropic.

In various embodiments, a bias is applied to at least one of the exposing the substrate to the modification gas and the exposing the modified surface to the removal gas. The bias power may be selected depending on the threshold sputter yield of the activated removal gas with the deposited metal on the substrate.

Another aspect involves apparatus for processing a substrate, the apparatus including: a process chamber including a showerhead and a substrate support for holding the substrate having a material, a plasma generator, and a controller having at least one processor and a memory, whereby the at least one processor and the memory are communicatively connected with one another, the at least one processor is at least operatively connected with flow-control hardware, and the memory stores machine-readable instructions for: causing identification of process conditions for an atomic layer etching process of the material using a modification gas and a removal gas; and causing performance of the atomic layer etching process on the material on the substrate by: causing introduction of a modification gas to modify a surface of the material, the modification gas having a modification energy and a desorption energy with respect to the material to be etched, and causing introduction of the removal gas and generation of a plasma to remove the modified surface, whereby the modification energy is less than the desorption energy, and the desorption energy is less than a surface binding energy of the material.

In various embodiments, instructions for causing introduction of the process conditions includes instructions for causing selection of a substrate temperature for performing the exposing the substrate to the modification gas, such that the energy provided by the substrate temperature is between the modification energy and the desorption energy.

In various embodiments, instructions for causing introduction of the process conditions includes instructions for causing selection of a bias power for applying a bias during the exposing the modified surface to the removal gas, such that the energy provided by the bias is between the desorption energy and the surface binding energy.

In various embodiments, the modification gas is selected to adsorb to the material without etching the material. In various embodiments, the removal gas is selected to remove the modified surface without etching underlying unmodified material.

In some embodiments, instructions for causing introduction of the process conditions includes instructions for causing selection of the process conditions from any one or more of: temperature, chamber pressure, plasma power, bias power, modification gas flow, and exposure time.

The apparatus may also include instructions for causing modification of the process conditions within a process window. The process window may be defined by a minimum and maximum bias power delivered to a pedestal holding the substrate such that the minimum bias power is the minimum used to remove the modified surface and the maximum bias power is the highest bias that can be used without sputtering the material underlying the modified surface.

In various embodiments, instructions for causing performance of the atomic layer etching also includes instructions for causing purging of the process chamber housing the substrate between instructions for causing introduction of the modification gas and the causing of the introduction of the removal gas.

Another aspect involves an apparatus for processing a substrate, the apparatus including: a process chamber including a showerhead and a substrate support for holding the substrate, a plasma generator, and a controller having at least one processor and a memory, whereby the at least one processor and the memory are communicatively connected with one another, the at least one processor is at least operatively connected with flow-control hardware, and the memory stores machine-readable instructions for: causing the temperature of the substrate support having the substrate including tantalum to be set to a temperature less than about 0° C.; and causing performance of atomic layer etching of the tantalum by: causing introduction of a modification gas to modify a surface of the tantalum, and causing the introduction of a removal gas and generation of a plasma to remove the modified tantalum.

In various embodiments, the instructions for causing the temperature of the substrate support to be set to a temperature less than about 0° C. includes instructions for causing the temperature of the substrate support to be set to a temperature between about −20° C. and about 0° C.

In various embodiments, instructions for causing performance of the atomic layer etching of the tantalum also includes instructions for causing purging of the process chamber housing the substrate between instructions for causing introduction of the modification gas and the causing of the introduction of the removal gas. Purging can be done using any inert gas such as $N_2$, Ar, Ne, He, and their combinations.

In various embodiments, the memory further stores instructions for causing a bias to be applied to the substrate support for holding the substrate during at least one of the introduction of the modification gas and introduction of the removal gas. The bias power may be selected depending on the threshold sputter yield of the activated removal gas with the deposited metal on the substrate.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Etching processes often involve exposing a material to be etched to a combination of etching gases to remove the material. However, such removal may not be self-limiting and in some cases may etch more than desired, or result in an undesirable feature profile. As feature sizes shrink, there is a growing need for atomic scale processing such as Atomic Layer Etch (ALE). Atomic layer etch is a cyclic process of nominally self-limiting steps that result in digital and small changes in film thicknesses. The process is characterized by smoothness and conformality, and also directionality in the case of some ALE.

ALE is a multi-step process used in advanced semiconductor manufacturing (e.g. technology node<10 nm) for the blanket removal or pattern-definition etching of ultra-thin layers of material with atomic scale in-depth resolution and control. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

Figure 1A:
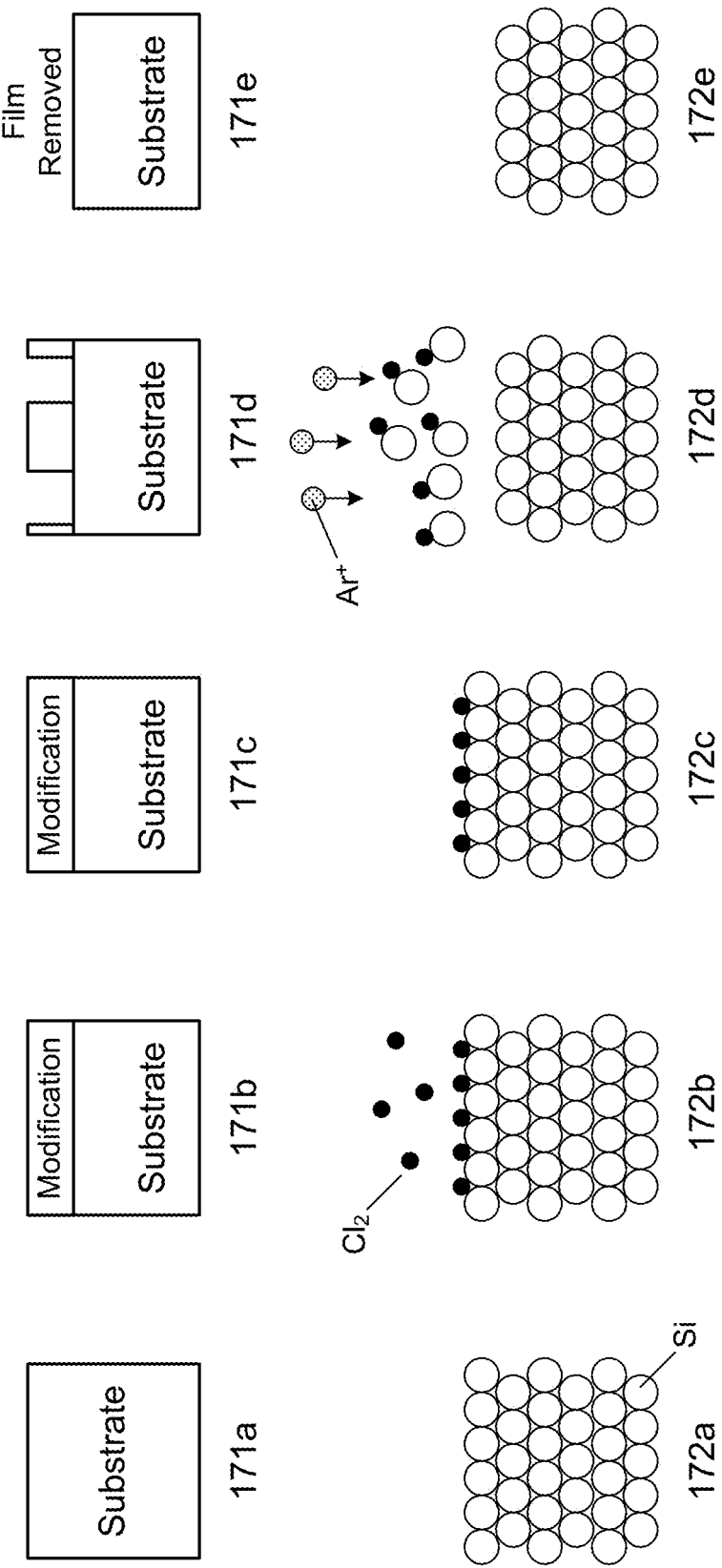
FIG. 1A shows example schematic diagrams of substrates undergoing atomic layer etching.

ALE may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. FIG. 1A shows two example schematic illustrations of an ALE cycle. Diagrams 171a-171e show a generic ALE cycle. In 171a, the substrate is provided. In 171b, the surface of the substrate is modified. In 171c, the next step is prepared. In 172d, the modified layer is being etched. In 171e, the modified layer is removed. Similarly, diagrams 172a-172e show an example of an ALE cycle for etching a silicon film. In 172a, a silicon substrate is provided, which includes many silicon atoms. In 172b, reactant gas chlorine is introduced to the substrate which modifies the surface of the substrate. The schematic in 172b shows that some chlorine is adsorbed onto the surface of the substrate as an example. Although chlorine is depicted in FIG. 1A, any chlorine-containing compound or suitable reactant may be used. In 172c, the reactant gas chlorine is purged from the chamber. In 172d, a removal gas argon is introduced with a directional plasma as indicated by the Ar$^+$ plasma species and arrows, and ion bombardment is performed to remove the modified surface of the substrate. During this operation, a bias is applied to the substrate to attract ions toward it. In 172e, the chamber is purged and the byproducts are removed.

A cycle may only partially etch about 0.1 nm to about 50 nm of material, or between about 0.1 nm and about 20 nm of material, or between about 0.1 nm and about 2 nm of material, or between about 0.1 nm and about 5 nm of material, or between about 0.2 nm and about 50 nm of material, or between about 0.2 nm and about 5 nm of material. The amount of material etched in a cycle may depend on the purpose of etching in a self-limiting manner. In some embodiments, a cycle of ALE may remove less than a monolayer of material.

ALE process conditions, such as chamber pressure, substrate temperature, plasma power, frequency, and type, and bias power, depend on the material to be etched, the composition of the gases used to modify the material to be etched, the material underlying the material to be etched, and the composition of gases used to remove the modified material. However, the combination of these factors make performing ALE for etching a variety of materials challenging.

Given the increasing number of new materials being introduced into integrated circuit processing and the large number of combinations of process parameters (gas pressure, wafer temperature, plasma power, ion energy, etc.), achieving an ALE process that does not sputter but also etches in a layer-by-layer self-limiting way for a given material is challenging. A universally applicable tool to perform ALE process development is needed. In addition, having the ability to predict ALE performance or even applicability would focus research and development on materials that are the most promising candidates for ALE.

Provided herein is a method of performing "designer" ALE based on an "ALE synergy" metric for the material to be etched. Disclosed embodiments allow one to design an ALE process using the ALE synergy metric to achieve self-limiting removal of the material while reducing sputtering of the material to be etched, or removal or sputtering of material underlying the material to be etched. Alternately, for an existing process tool and set of accessible process parameters, disclosed embodiments allow one to predict whether a given material can be removed using ALE and, if so, the anticipated quality of the etching. In addition, disclosed embodiments can be used to maximize desired etch selectivity between materials, by designing one material to be etched while another does not under the same conditions.

Disclosed embodiments are applicable to a wide class of materials including semiconductors (e.g., silicon, germanium, silicon germanium (SiGe), gallium nitride (GaN); metals (e.g., tungsten, cobalt, copper, tantalum); dielectrics (e.g., silicon oxide ($SiO_2$), silicon nitride (SiN)); and ashable hard masks such as carbon. Disclosed embodiments are also suitable for etching compounds such as nitrides and oxides. It can be utilized to develop new or improved unit or integrated processes as well as standalone or clustered hardware. The methodology can be implemented with appropriate computer software for offline use or embedded in a process tool for recipe development, process qualification, or process control.

The methodology is universally applicable but can be customized for a given material-process tool combination, lending itself to implementation as a computer algorithm. Being based on atomistic energy considerations, the approach is inherently scalable and can be applied to both present and future device technology nodes. Its ability to predict how well an ALE process is working or would work relative to the ideal is an additional benefit of the approach.

Disclosed embodiments are suitable for performing ALE for a broad class of materials of interest in integrated circuit technology (e.g. semiconductors such as silicon, germanium, gallium nitride; metals such as tantalum, tungsten, cobalt; dielectrics such as silicon oxide, and ashable hardmask materials such as amorphous or diamond-like carbon).

In the following discussion, non-limiting examples are provided for ALE of silicon (e.g. done by alternating $Cl_2$-plasma and $Ar^+$ bombardment) and ALE of tantalum.

ALE involves splitting the etch process into two (or more) separate steps: modification (operation A) and removal (operation B). For example, the modification operation step modifies the surface layer so that it can be removed easily during the removal operation. A thin layer of material is removed per cycle, where a cycle includes modification and removal, and the cycle can be repeated until the desired depth is reached. Synergy means that favorable etching occurs due to interaction of operations A and B. In ALE, operations A and B are separated in either space or time.

Favorable atomic layer etching occurs due to the interaction of operations A and B, and the following "ALE synergy" metric is used to quantify the strength and impact of the synergistic interaction. ALE synergy is calculated by:

$$ALE\ Synergy\ \% = \frac{EPC - (A + B)}{EPC} \times 100\% \qquad \text{(eqn. 1)}$$

where EPC ("etch per cycle") is the thickness of substrate material removed in one ALE cycle, typically averaged over many cycles, and A and B are contributions to the EPC from the stand-alone modification and removal operations, respectfully, measured as reference points by performing these operations independently.

Synergy is a test that captures many aspects of ALE behavior, and is well-suited to compare different ALE conditions or systems. It is an underlying mechanism for why etching in operation B stops after reactants from operation A are consumed. It is therefore responsible for the self-limiting behavior in ALE benefits such as aspect ratio independence, uniformity, smoothness, and selectivity.

Figure 1B:
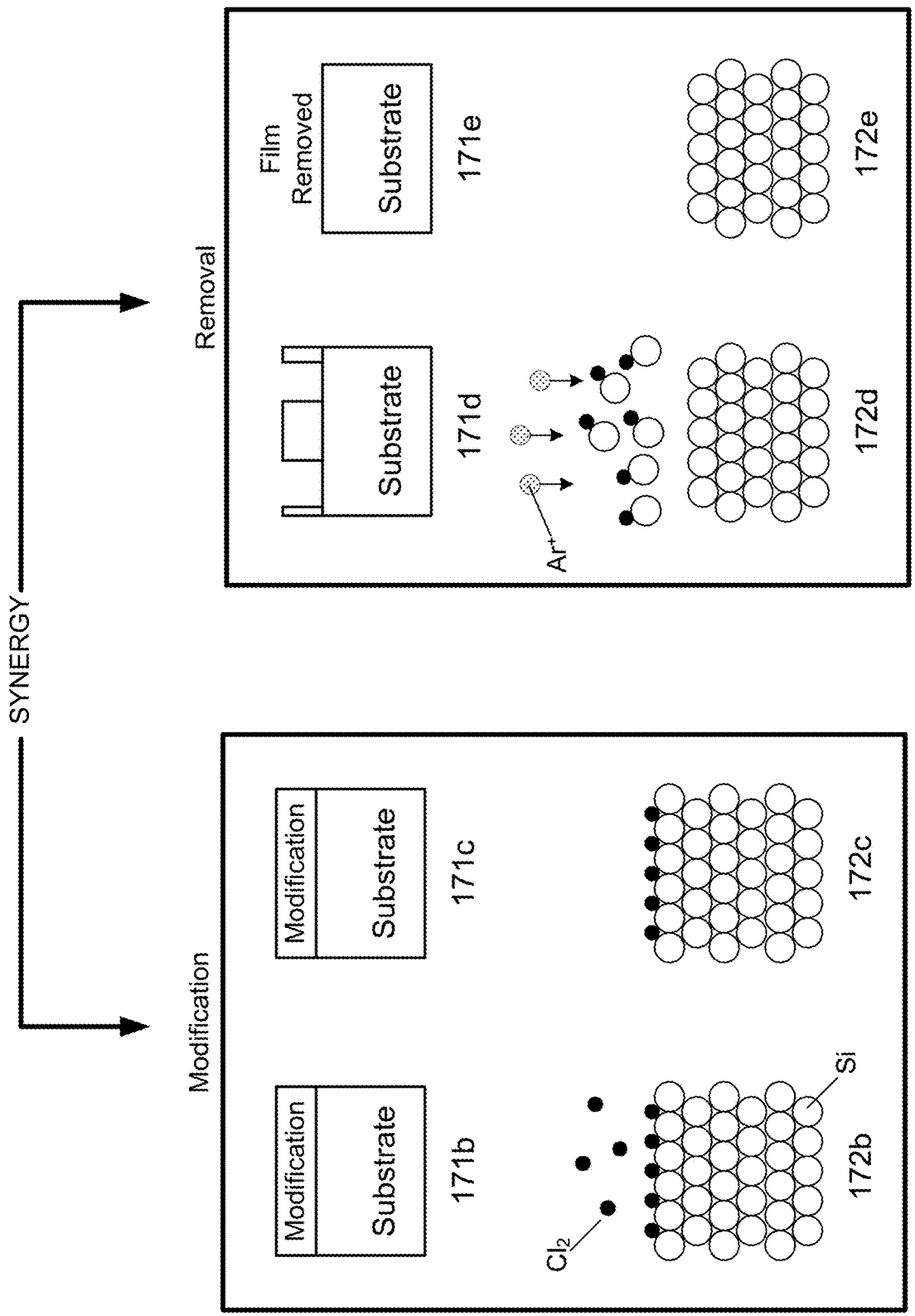
FIG. 1B shows the synergy of atomic layer etching based on the schematic diagrams of substrates from FIG. 1A.

FIG. 1B is schematic illustration of ALE synergy illustrated for silicon. By way of example, consider ALE of silicon carried out using a chlorination operation A and argon ion bombardment operation B. If the overall ALE process removes 1 nm/cycle, but only 0.1 nm/cycle from A alone and 0.1 nm/cycle from B alone, then synergy is 80%. A high-synergy process might have synergy above about 90% as compared to below about 60% for a low-synergy process.

Disclosed embodiments are structured to achieve an ALE process with high synergy—the ideal being an ALE process with synergy being 100%. This ideal may not be possible to achieve in all cases given practical considerations such as the accessible range of process conditions, wafer throughput requirements, etc. However, tolerance for synergy less than the ideal of 100% will depend on the application and the technology node, and presumably each successive technology generation will demand higher levels of ideality.

Disclosed embodiments for designing an ALE process with high synergy is based on achieving a hierarchical relationship between five defining energies that characterize an overall ALE process and the energy barriers that are overcome to achieve etch with synergy close to 100%.

This relationship is as follows:

$$E_{mod} < \varepsilon_A < E_{des} < \varepsilon_B < E_O \qquad \text{(eqn. 2)}$$

The three energies written with upper case E's ($E_O$, $E_{mod}$, and $E_{des}$) are determined by properties of the material to be etched and the reactant.

$E_O$ is the surface binding energy of the unmodified material and is the cohesive force that keeps atoms from being removed from the surface. Values are commonly estimated from heats of sublimation and are typically in the range of 2-10 eV per atom.

$E_{mod}$ is the adsorption barrier to modify the surface and arises from the need to dissociate reactants or reorganize surface atoms. This barrier may be negligible when plasma is used to dissociate the reactants into radicals, such as during plasma chlorination of silicon.

The desorption barrier $E_{des}$ is the energy used to remove a by-product from the modified surface. For example, in ALE of silicon, the by-product may be $SiCl_2$ (g) with about 2.9 eV desorption energy. This barrier is related to volatility and thermal desorption temperatures.

Experimental values for the E's are found in chemical-physical handbooks and in published scientific papers or can be obtained from ab initio calculations. By way of example, for silicon ALE with $Ar^+$ ions/$Cl_2$, $E_{mod}$=0.3 eV<$E_{des}$~2.9 eV<$E_O$=4.7 eV.

$\varepsilon_A$ and $\varepsilon_B$ are energies in the surroundings in operations A and B, respectively. In terms of rates, a given reaction will proceed if the energy delivered is high enough as compared to the energy barrier. This energy could be provided by a flux of suitably energetic ions, electrons, etc. (allowing the possibility of a directional energy source) or thermally with an Arrhenius-type relation for the temperature dependence (viz, rate is or characterized by $e^{-E/kT}$).

$\varepsilon_A$ and $\varepsilon_B$ depend on equipment and process conditions and, within the accessible range of hardware and process parameters, are chosen to provide a high-synergy ALE etch for a given material system.

With regard to temperature, increasing the average temperature by a small amount could dramatically increase the delivered energy. For example, a gas satisfying a Maxwell-Boltzmann distribution has average energy <E>=3/2 kT. Raising temperature from, for example, room temperature of 25° C. (300K) to 325° C. (600K) will double <E>. However, the increase in high energy atoms in the exponential tail of the distribution will increase far more than two times—in this case, the population of atoms having E>1 eV increases by a factor of almost a billion.

The energy dependence of the removal rate for ions depends on the square root of ion energy relative to the threshold energy, with a proportionality constant that is inversely proportional to the surface binding energy $E_O$. With most of the incident ion's kinetic energy dissipated as heat in atom-atom collisions, ion energy of about 20 times the barrier energy is used to provide sufficient energy source for ALE. For example, a 2.5 eV barrier may be overcome using incident ion energy of greater than about 50 eV since about 95% of the incident ions will not be available to drive the ALE process after thermalizing with the wafer lattice.

The order of the inequalities in eqn. (2) indicates that the highest synergy occurs when adsorption takes place without desorption in operation A, and when desorption takes place without removing the unmodified material in operation B. This relation represents the energy "window" for the ALE process. Thus, $E_O$ and $E_{mod}$ set the upper and lower bounds of the inequality, so the larger their energy difference, the more latitude one has to achieve sufficient synergy.

The inter-related nature of the E's and epsilons shown in eqn. (2) underscores that fact that success of an ALE process will depend not only on properties of the material-reactant combination (E's), but also on one's choice of reactor conditions ($\varepsilon$'s) and energies to meet the criteria for high synergy. Furthermore, throughput is also a factor, as overcoming the barrier depends on constraints in the operation times—analogous to the situation in which a chemical reaction may be thermodynamically favored (i.e. Gibbs free energy change is large and negative) but where the kinetics are such that the reaction time is impractically long.

Disclosed embodiments can also be used to design for etch selectivity between materials, by designing one material to etch while another does not under the same conditions. This is a potential benefit of the methodology, given the difficulty of achieving high etch selectivity (such as between a substrate and a masking layer, between a material to be etched and an underlying etch stop layer, etc.)

A similar formalism to eqns. (1) and (2), and a similar methodology based on first-principles energetic considerations can be developed for Atomic Layer Deposition (ALD), given that ALD and ALE are similar being sequential, self-limiting, atomistic processes. In some embodiments, ALD and ALE may be combined in a series of operations used to fabricate semiconductor devices. For example, further description regarding integration of ALD and ALE are described in U.S. Pat. No. 9,576,811 issued Feb. 21, 2017 entitled "INTEGRATING ATOMIC SCALE PROCESSES: ALD (ATOMIC LAYER DEPOSITION) AND ALE (ATOMIC LAYER ETCH)" which is herein incorporated by reference in its entirety.

Figure 2:
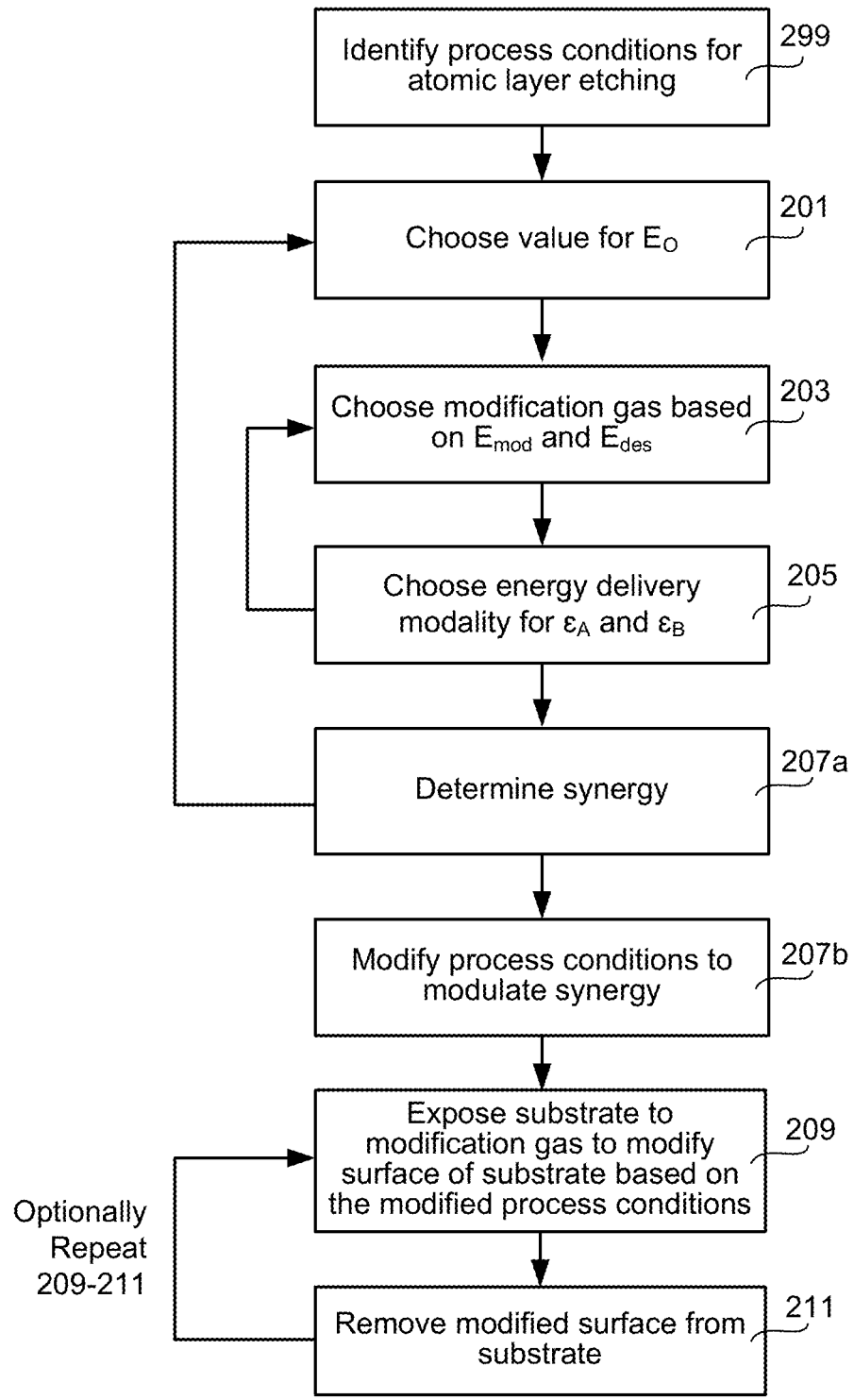
FIG. 2 is a process flow diagram depicting operations for a method in accordance with disclosed embodiments.

FIG. 2 provides a process flow diagram depicting operations for selecting the material to be etched, the reactants used to etch using ALE, and the process conditions to effectively etch using ALE without sputtering either the material to be etched or any underlying material and without etching the material too quickly in a non-self-limiting manner.

In operation 299, process conditions for atomic layer etching are identified. Example process conditions include temperature, chamber pressure, plasma power, bias power, modification gas flow, and exposure time. These process conditions may be process conditions used during modification, or during removal, or both. Example process conditions include substrate temperature for performing the exposing the substrate to the modification gas, and bias power for applying a bias during exposing of the modified surface to a removal gas, performed in operation 211 as described below.

In operation 201, $E_O$ is determined. $E_O$ sets the upper energy boundary of the energy inequality given in Eqn. 2. $E_O$ is determined by the choice of material, so in effect choosing $E_O$ is equivalent to choosing the material to etch. If the choice of material is to be determined, one may select a material having an energy $E_O$ as large as possible since this would give the largest process window in which to achieve high synergy.

In operation 203, a reactant or modification gas for etching the material selected in operation 201 is chosen. This choice will dictate the values of $E_{mod}$ and $E_{des}$ depending on the interaction of the modification gas with the film to be etched. The value for $E_{mod}$ should be small enough to give flexibility for the choices of $\varepsilon_A$ and $\varepsilon_B$ but large enough so that reactant will react but does not desorb ($E_{des} > E_{mod}$). These values can be estimated from ab initio calculations or experimental tests with Arrhenius equation (for $E_{mod}$) and from volatility measurements, ab initio calculations, or thermal desorption temperatures (for $E_{des}$).

In operation 205, an energy delivery modality is selected such that the modality determines values for $\varepsilon_A$ and $\varepsilon_B$ whereby $E_{mod} < \varepsilon_A < E_{des} < \varepsilon_B < E_O$. These $\varepsilon_A$ and $\varepsilon_B$ values represent the useful energy delivered to the surface (e.g. energetic flux of ions, photons or electrons, chemical energy, etc.) or available from the surroundings (e.g. substrate or plasma temperature). In various embodiments, $\varepsilon_A$ represents the energy applied during the modification operation (operation A), which is sufficient to modify the substrate ($E_{mod} < \varepsilon_A$), but low enough to prevent the modification gas from reacting with the surface ($\varepsilon_A < E_{des}$). In various embodiments, $\varepsilon_B$ represents the energy applied during the removal operation (operation B), which is sufficient to remove the modified surface ($E_{des} < \varepsilon_B$), and low enough to prevent sputtering of the material to be etched ($\varepsilon_B < E_O$). For any given material, depending on the modification gas, $E_{mod}$ and $E_{des}$ may vary.

In the case of ALE of silicon using $Cl_2$ as a modification gas and $Ar^+$ as a removal gas, $\varepsilon_A$ can be determined by the temperature of the $Cl_2$ (thermal) or the $Cl_2$ plasma, while $\varepsilon_B$ can be determined by the useful energy delivered by the Ar ions. For example, if plasma is used, this can affect reaction pathway (and thus $E_{mod}$ and $E_{des}$) and one may select a different modification gas. In various embodiments, the energy for operation A, or $\varepsilon_A$, is modulated by varying the temperature of the substrate during the modification operation, while the energy for operation B, or $\varepsilon_B$, is modulated by varying the plasma conditions during the removal operation (such as plasma power or bias power). Thus, to achieve ALE in a self-limiting manner, if the range between $E_{mod}$ and $E_{des}$ is small, the temperature range for performing the modification operation without causing desorption is small, and if the range between $E_{mod}$ and $E_{des}$ is large, the temperature range for performing the modification operation without causing desorption is large. If the range between $E_{des}$ and $E_O$ is small, the range of process conditions for performing the removal operation without sputtering is small, while if the range between $E_{des}$ and $E_O$ is large, the range of process conditions for performing the removal operation without sputtering is large.

In operation 207a, the synergy of the resulting ALE process is measured, and in operation 207b, the ALE process conditions are modified to increase the synergy further while still meeting Eqn 2 among the five energies. One could utilize a range of values and measure the individual and synergistic etch rates to calculate the synergy. For example, if $Ar^+$ ion bombardment is used, one could bias the wafer and run through a range of ion energies (e.g. 10-100 eV). This can be used to determine the bias window in which synergy is the highest.

In some embodiments, operation 201 may be repeated if the determined synergy is not a desired value. In some embodiments, operations 203 and 205 may be performed repeatedly to evaluate the energy delivery modality to select a modification gas having desirable synergy properties.

In operation 209, the substrate is exposed to the modification gas selected in operation 203 to modify the surface of the substrate based on the process conditions selected.

In operation 211, the modified surface is removed from the substrate, using process conditions such as bias power modified in operation 207b to maximize synergy. In some embodiments, operations 209 and 211 are repeated.

Table 1 shows example synergies for ALE of various materials using various modification gases for the modification operation and argon plasma for the removal.

TABLE 1

| Material | ALE Modification | ALE Removal | Measurements |
|---|---|---|---|
| Silicon | Chlorine plasma | 50 eV Ar+ | Synergy = 90% EPC = 0.70 nm/cycle $\alpha$ = 0.03 nm/cycle $\beta$ = 0.04 nm/cycle |

TABLE 1-continued

| Material | ALE Modification | ALE Removal | Measurements |
|---|---|---|---|
| Germanium | Chlorine plasma | 25 eV Ar+ | Synergy = 66%<br>EPC = 0.80 nm/cycle<br>α = 0.20 nm/cycle<br>β = 0.07 nm/cycle |
| Amorphous carbon | Oxygen plasma | 50 eV Ar+ | Synergy = 97%<br>EPC = 0.31 nm/cycle<br>α = 0 nm/cycle<br>β = 0.01 nm/cycle |
| Tungsten | Chlorine plasma | 60 eV Ar+ | Synergy = 95%<br>EPC = 0.21 nm/cycle<br>α = 0 nm/cycle<br>β = 0.01 nm/cycle |
| Gallium nitride | Chlorine plasma | 70 eV Ar+ | Synergy = 91%<br>EPC = 0.33 nm/cycle<br>α = 0 nm/cycle<br>β = 0.03 nm/cycle |
| Silicon dioxide | Chlorine plasma | 70 eV Ar+ | Synergy = 80%<br>EPC = 0.50 nm/cycle<br>α = 0 nm/cycle<br>β = 0.10 nm/cycle |

Tantalum is used as a demonstrated example of determining how to modulate process conditions for tantalum ALE using the operations of FIG. 2. In operation 201, the value for $E_O$ is determined by calculating the surface binding energy of tantalum. Literature values are taken to evaluate the surface binding energy of tantalum.

In operation 203, a reactant is chosen based on $E_{mod}$ and $E_{des}$. For example, the adsorption barrier ($E_{mod}$) are taken to be ~0 if plasma is used during modification. $E_{des}$ is determined by estimating the thermal desorption temperatures which are found in literature for some reactant material systems. The energy delivery modality is determined in operation 205 for $\varepsilon_A$ and $\varepsilon_B$. The synergy is then calculated in operation 207a, and the process conditions modified if needed in operation 207b. It will be understood that in various embodiments, any one or more inert carrier gases (such as Na, Ar, Ne, He, or combinations thereof) may be flowed during any of the modification or the removal operations. Additionally, for an ALE cycle, the chamber may be purged after modification, or after removal, or both in some embodiments. In some embodiments, an ALE cycle includes modification, purge, removal, and purge. Purging may involve a sweep gas, which may be a carrier gas used in other operations or a different gas. In some embodiments, purging may involve evacuating the chamber.

Figure 3:
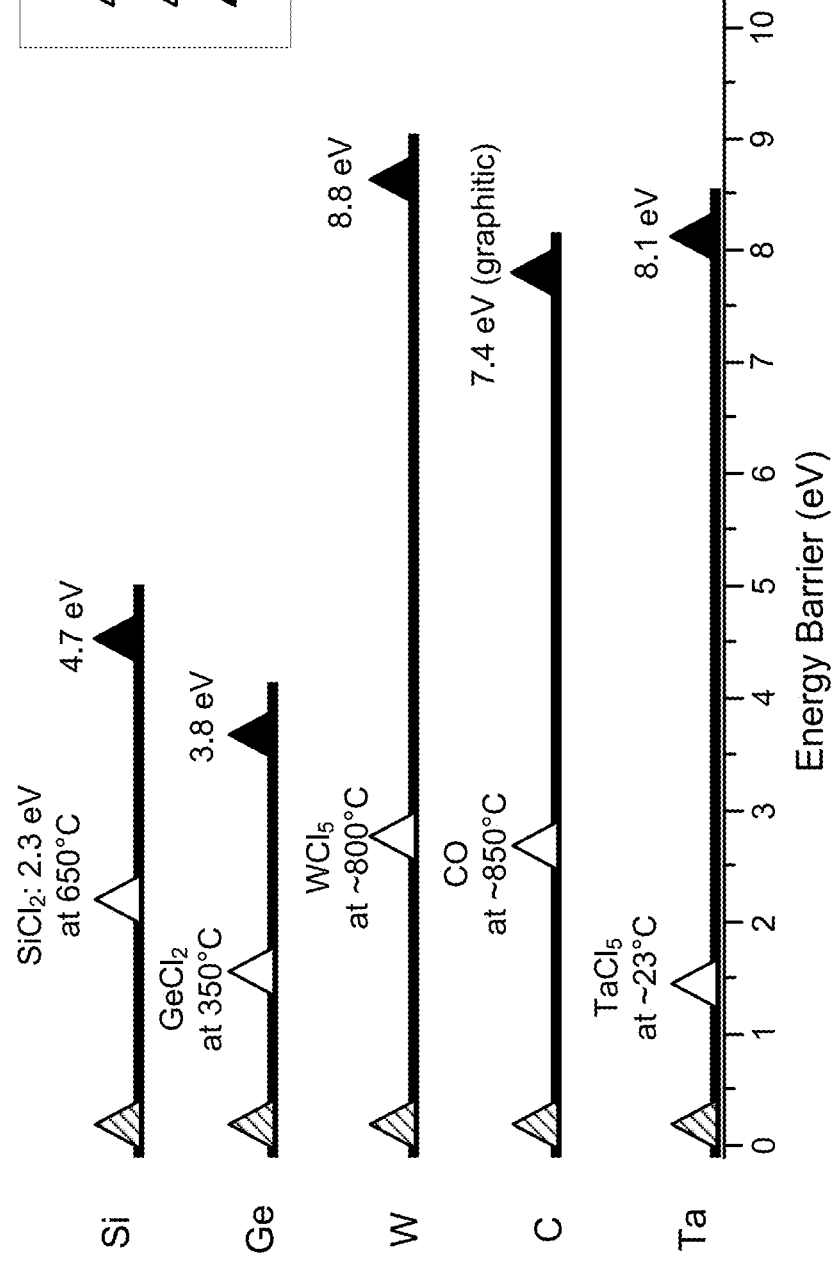
FIG. 3 shows energy barriers for silicon, germanium, tungsten, carbon, and tantalum for $E_{mod}$, $E_{des}$, and $E_O$.

FIG. 3 shows an example of how tantalum ALE works based on the relative adsorption, desorption, and surface binding energies when chlorine is used as the modification gas and argon is used as the removal gas relative to the ALE of other elemental materials. The surface binding energies $E_O$ (black triangles) are determined by literature values, as in FIG. 4 which is further described below. The absorption barrier $E_{mod}$ (striped shaded triangles) are taken to be ~0 since plasma is used. The desorption energy $E_{des}$ is inferred from the desorption temperature.

For all examples provided in FIG. 3, the $E_{mod}$ is taken as about 0 eV. For silicon, the desorption temperature is 650° C. for $SiCl_2$, and the $E_{des}$ is inferred from this temperature to be about 2.3 eV for etching using chlorine (to form by-product $SiCl_2$ when a silicon surface is modified by chlorine). The surface binding energy of silicon is 4.7 eV.

For germanium, the desorption temperature is at 350° C. for $GeCl_2$, and $E_{des}$ is inferred from this temperature to be between 1 and 2 eV (to form by product $GeCl_2$ when a germanium surface is modified by chlorine). The surface binding energy of germanium is 3.8 eV.

For tungsten, the $E_{des}$ inferred from desorption temperature of about 800° C. using chlorine as the modification gas is about 3 eV (to form a byproduct $WCl_5$ when a tungsten surface is modified by chlorine). The surface binding energy for tungsten is 8.8 eV.

For carbon, the $E_{des}$ inferred from desorption temperature of about 850° C. using oxygen as the modification gas is about 3 eV (to form a byproduct CO when a carbon surface is modified by oxygen). The surface binding energy for graphitic carbon is 7.4 eV.

For tantalum, the $E_{des}$ inferred from desorption temperature of about 23° C. using chlorine as the modification gas is about 1.5 eV (to form a byproduct $TaCl_5$ when a tantalum surface is modified by chlorine). The surface binding energy for tantalum is 8.1 eV.

The relative value for the desorption barrier (white triangles) is estimated based on thermal desorption temperatures, which are found in literature for these reactant-material systems. The temperatures indicated in FIG. 3 are the thermal desorption temperatures. The energy barriers for tantalum ALE suggest using low temperature during modification to suppress the chlorine reaction with tantalum, and a large window during the removal operation with respect to ion energy. This is because the window between $E_{mod}$ and $E_{des}$ is very small, and given that the desorption energy at desorption temperature 250° C. is very small, the processing temperature for ALE of tantalum should be low to ensure that the energy used during the modification operation (operation A) is within this small window to prevent chlorine from reacting with tantalum in a non-self-limiting manner. However, given the large energy gap between $E_{des}$ and $E_O$, a wide range of ion energy can be used during the removal operation (operation B) without risk of sputtering the tantalum surface given the high surface binding energy of tantalum.

Figure 4:
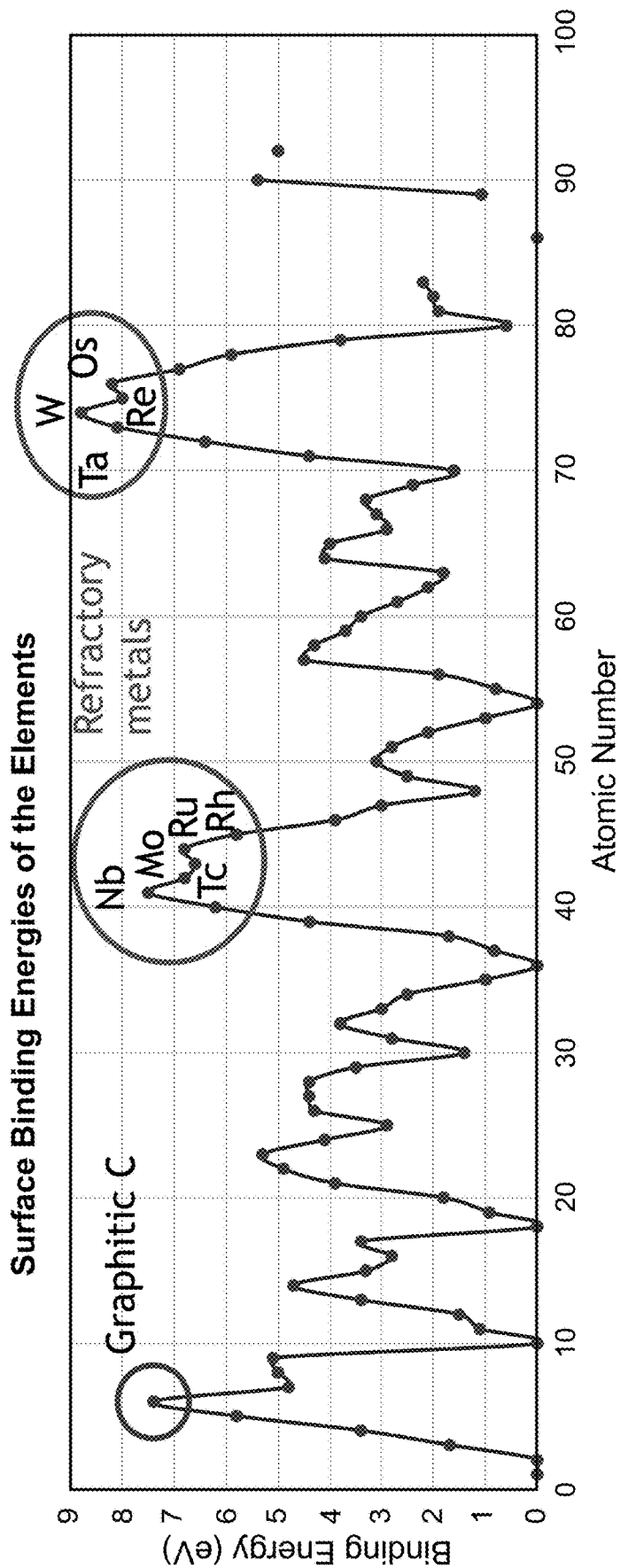
FIG. 4 is a graph of surface binding energies of elements in the periodic table of elements.

FIG. 4 shows surface binding energy for elemental materials, as determined by heats of sublimation. According to this plot, carbon and the refractory metals (W, Ta, Re, Nb, Mo, etc.) are good candidates for ALE. Out of the other materials with surface binding energy greater than about 6 eV, tantalum is particularly useful as this material is used as part of the barrier/liner in metallization in BEOL processing. Based on surface binding energy, ALE of tantalum should work well.

Figure 5A:
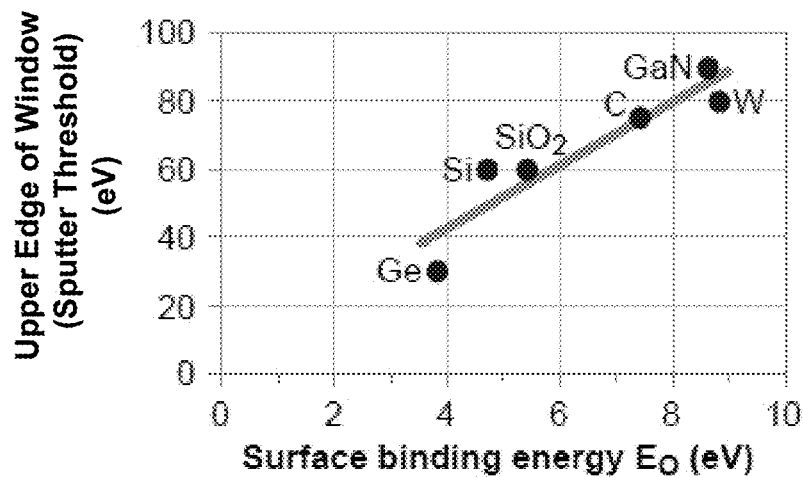
FIG. 5A shows a graph of sputter thresholds as a function of surface binding energy for various materials.
Figure 5B:
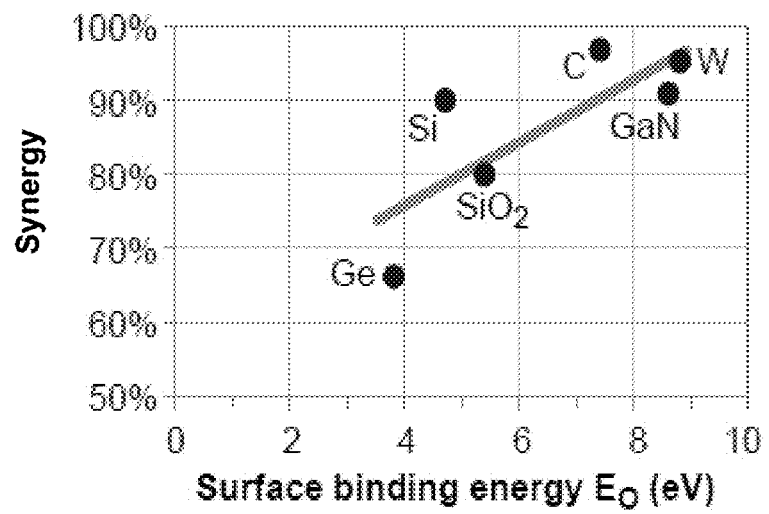
FIG. 5B shows a graph of synergy as a function of surface binding energy for various materials.
Figure 5C:
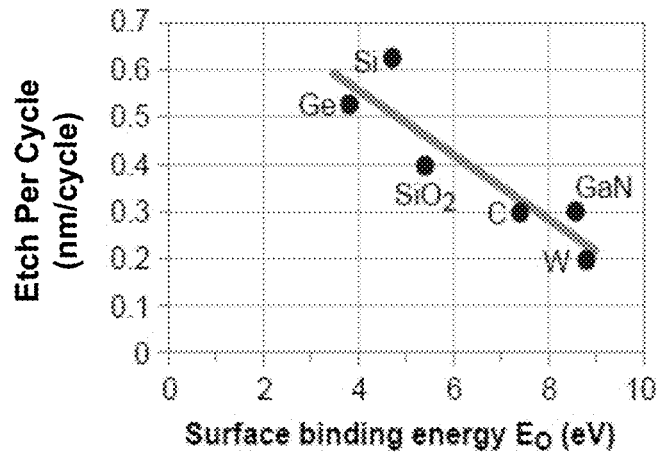
FIG. 5C shows a graph of etch per cycle as a function of surface binding energy for various materials.

FIGS. 5A-5C shows summary of material trends in ALE. As discussed, the trends suggest that other materials with high surface binding energy are good candidates for ALE. In FIG. 5A, the upper edge of window or the sputter threshold (as in the energy upon which the material would be sputtered, rather than modified) is plotted against the surface binding energy $E_O$. As shown, as the surface binding energy increases, the upper edge of the window increases. A higher upper edge of window allows for a broader range of energies that may be used to modify the material without sputtering it.

FIG. 5B shows synergy as calculated by Eqn. 1 as a function of surface binding energy $E_O$. As shown, as surface binding energy increases, synergy increases. These show that high surface binding energy materials are more likely to have a high synergy effect, and thus are good candidates for ALE.

FIG. 5C shows the etch per cycle (EPC) in nm/cycle as a function of surface binding energy $E_O$. As shown, as surface binding energy increases, the etch per cycle decreases. That is, less material is etched per cycle. This suggests that high surface binding energy materials are able to be more closely controlled for layer-by-layer self-limiting etching by ALE, whereas low surface binding energy materials are more likely to etch faster by ALE.

For the example of tantalum, in various embodiments, tantalum may be etched using ALE in accordance with certain disclosed embodiments. For example, upon identifying $E_O$, $E_{des}$, and $E_{mod}$ for using chlorine (as an example modification gas) for etching tantalum, a substrate having tantalum may be etched using the following example method.

Figure 6:
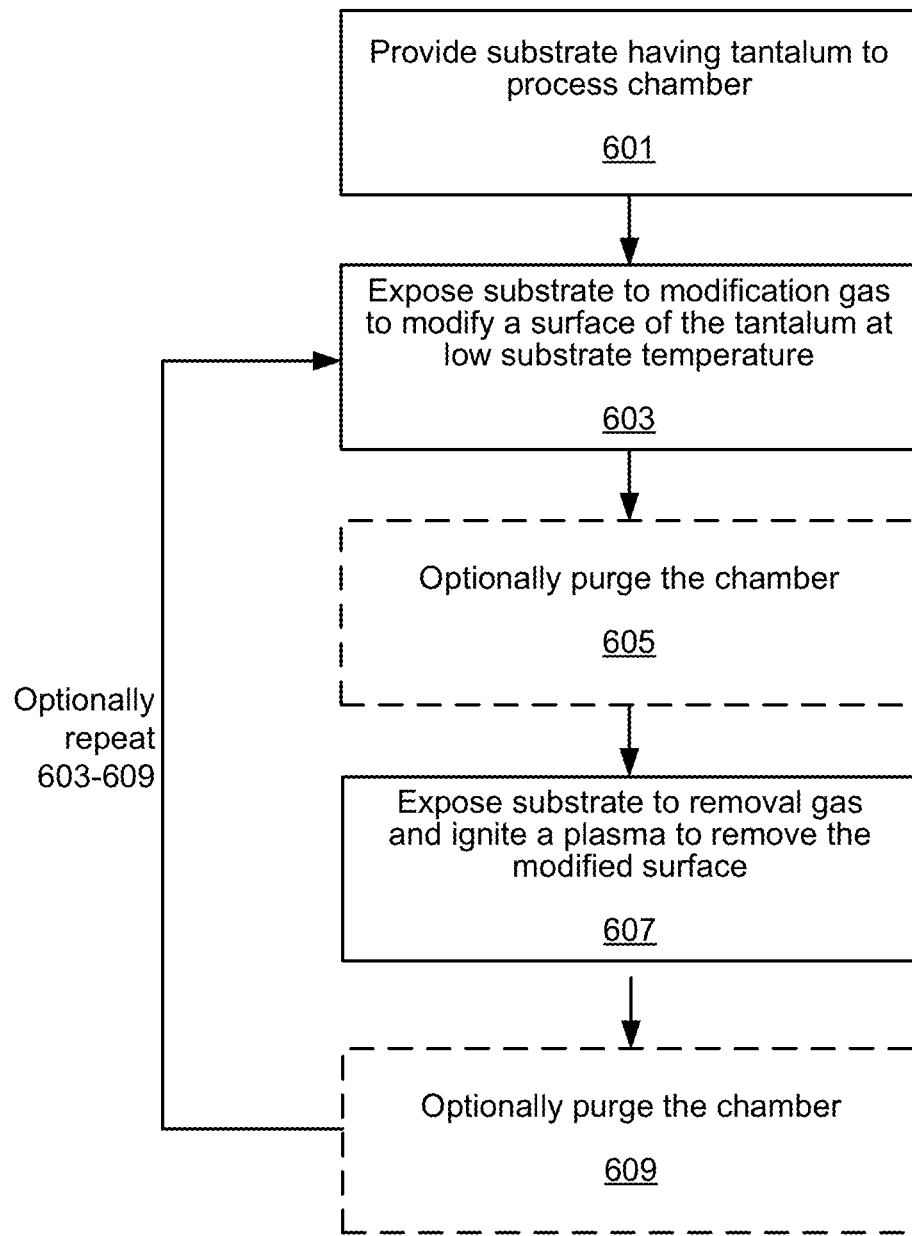
FIG. 6 is a process flow diagram depicting operations for a method in accordance with disclosed embodiments.

FIG. 6 shows an example process flow diagram of operations performed for atomic layer etching of tantalum in accordance with certain disclosed embodiments. As described above, after determining synergy for tantalum, atomic layer etching of tantalum can be achieved by toggling process conditions.

In operation 601, a substrate having tantalum is provided to a process chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In various embodiments, the substrate includes tantalum or tantalum derivatives. In some embodiments, the substrate includes tantalum nitride, or two or more layers of tantalum and/or tantalum nitride.

In operation 603, the substrate is exposed to a modification gas to modify a surface of the tantalum at a low substrate temperature. During this operation, or prior to introducing the gas but after providing the substrate to the process chamber, the substrate is cooled to a low temperature, a low temperature being a temperature at, about, or less than about 0° C., such as between −30° C. and about 0° C.

The modification gas modifies a surface of the tantalum such that the energy applied during modification, such as low temperature, achieves an energy between the modification energy (energy sufficient to modify the surface) and the desorption energy. The temperature remains low to prevent the modification gas from reacting with the tantalum, as such reaction would prevent the self-limiting behavior of atomic layer etching from being performed. For example, at a temperature of about 60° C., etching of the tantalum would occur when exposed to chlorine gas, therefore not resulting in an ALE process.

In various embodiments, the modification gas flow may be modulated to vary the amount of modification gas introduced to the substrate. The substrate may be exposed to the modification gas for any suitable exposure time. In some embodiments, the substrate is exposed for an exposure time sufficient to adsorb the modification gas onto the surface of the tantalum. In some embodiments, the exposure time is at least about 1 second, or about 1 second, or about 2 seconds.

In some embodiments, during operation 603, a plasma is also ignited to form the modified surface of the tantalum. Plasma increases adsorption time by enabling faster adsorption kinetics. For example, plasma lowers energy barrier Ewes by converting the modification gas to radicals. In some embodiments, a chlorine-based plasma may be generated during this operation. The species generated from a chlorine-based plasma can be generated in situ by forming a plasma in the process chamber housing the substrate or they can be generated remotely in a process chamber that does not house the substrate such as a remote plasma generator, and can be supplied into the process chamber housing the substrate. In various embodiments, the plasma may be an inductively coupled plasma or a capacitively coupled plasma or a microwave plasma. Power for an inductively coupled plasma may be set at between about 50 W and about 2000 W, such as about 900 W. Power may be set at a low enough level so as not to cause direct plasma etching of the substrate.

In a modification operation, a substrate may be modified using a halogen-containing chemistry. For example, a substrate may be chlorinated by introducing chlorine into the chamber. Chlorine is used as an example modification chemistry in disclosed embodiments, but it will be understood that in some embodiments, a different modification chemistry is introduced into the chamber. Examples include bromine, iodine, sulfur hexafluoride, silicon tetrafluoride, and boron trichloride ($BCl_3$).

In operation 605, the chamber is optionally purged. In a purge operation, non-surface-bound active chlorine species may be removed from the process chamber. This can be done by purging and/or evacuating the process chamber to remove non-adsorbed modification chemistry, without removing the adsorbed layer. The species generated in a chlorine-based plasma can be removed by stopping the plasma and allowing the remaining species to decay, optionally combined with purging and/or evacuation of the chamber. Purging can be done using any inert gas such as $N_2$, Ar, Ne, He, and their combinations.

In operation 607, the substrate is exposed to a removal gas and a plasma is ignited to remove the modified surface. In various embodiments, the removal gas is argon. In some embodiments, neon or krypton may be used. In a removal operation, the substrate may be exposed to an energy source (e.g. activating or ion bombardment gas or chemically reactive species that induces removal), such as argon or helium, to etch the substrate by providing enough energy to desorb the modified tantalum surface but insufficient to sputter the tantalum such that energy is less than the surface binding energy. In some embodiments, removal may be isotropic. In some embodiments, the modified surface in operation 607 can be removed by raising substrate temperature, but such removal is isotropic. For example, in some embodiments, removal using heat may be used for desorption, but such removal may be isotropic.

The estimated rate of desorption is lower at higher temperatures than lower temperatures, and thus in various embodiments, plasma is ignited to increase the rate of desorption. Ions generated from the plasma allow for removal at low temperatures using anisotropic etching. Using ions allows an alternative technique to etch to perform etching directionally and to perform an etching process that is not dependent on Arrhenius rate law. In some embodiments, a bias is applied during at least one of operation 607 and 603 to aid removal by atomic layer etching. It will be understood that substantial energy loss such as about 90% of energy occurs due to collisions, and thus anisotropic etching by applying a bias helps overcome energy losses to effectively remove a modified tantalum layer.

During removal, a bias may be optionally applied to facilitate directional ion bombardment. The bias power is selected to prevent sputtering but allow the removal gas to enter the feature and etch the tungsten at or near the opening of the feature to thereby open it. The bias power may be selected depending on the threshold sputter yield of the activated removal gas with the deposited metal on the substrate. Sputtering as used herein may refer to physical removal of at least some of a surface of a substrate. Ion bombardment may refer to physical bombardment of a species onto a surface of a substrate.

In operation 609, the chamber is optionally purged to remove reacted by-products from the chamber. The chamber may be purged using any of the gases or techniques as described above with respect to operation 605.

As shown, in some embodiments, operations 603-609 may be optionally repeated as necessary to etch the desired amount of tantalum from the substrate.

Apparatus

Inductively coupled plasma (ICP) reactors which, in certain embodiments, may be suitable for atomic layer etching (ALE) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 7:
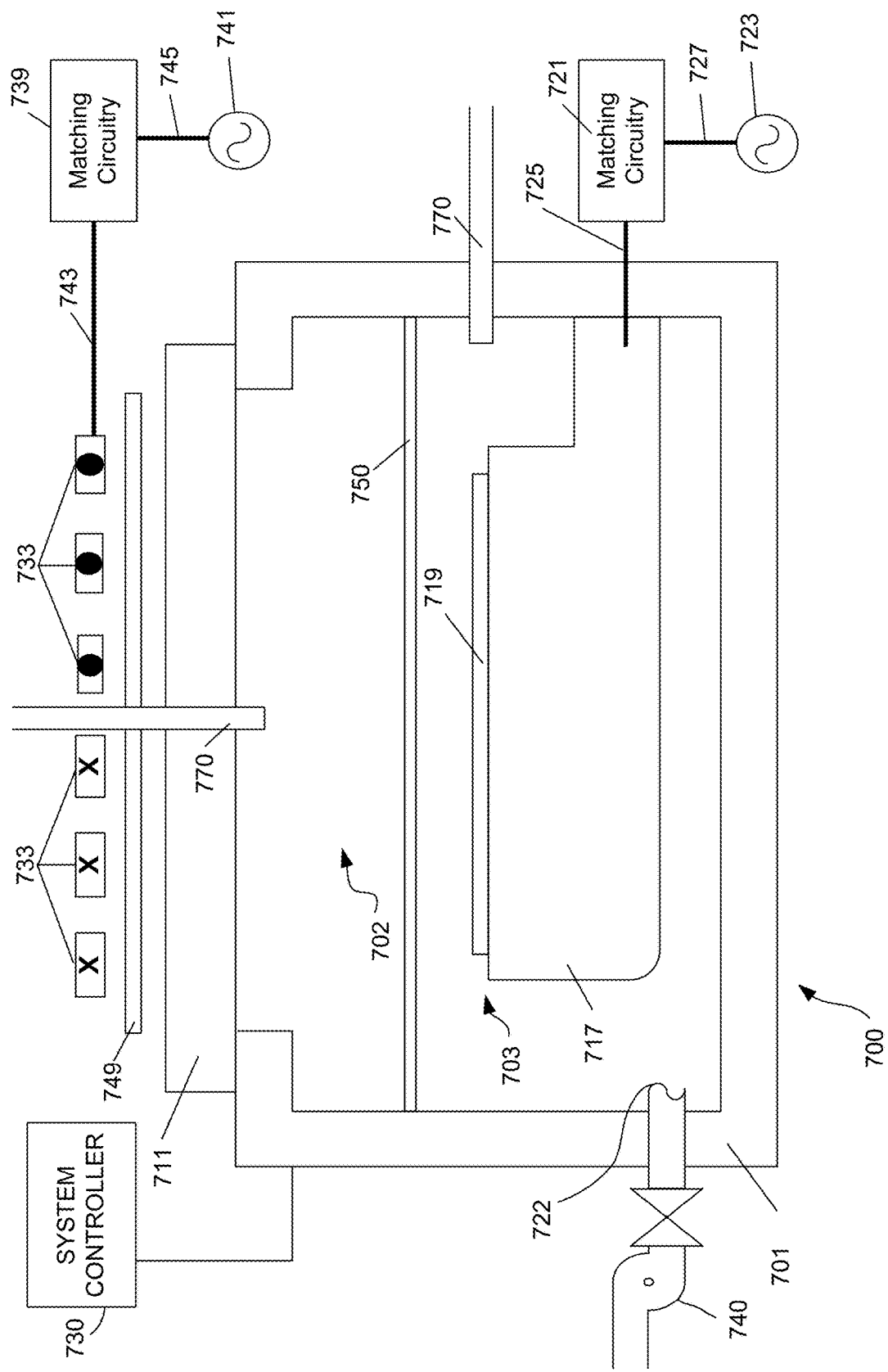
FIG. 7 is a schematic diagram of an example process chamber for performing disclosed embodiments.

FIG. 7 schematically shows a cross-sectional view of an inductively coupled plasma etching apparatus 700 appropriate for implementing certain embodiments herein, an example of which is a Kiyo™ reactor, produced by Lam Research Corp. of Fremont, Calif. The inductively coupled plasma apparatus 700 includes an overall process chamber 701 structurally defined by chamber walls 701 and a window 711. The chamber walls 701 may be fabricated from stainless steel or aluminum. The window 711 may be fabricated from quartz or other dielectric material. An optional internal plasma grid 750 divides the overall processing chamber 701 into an upper sub-chamber 702 and a lower sub-chamber 703. In most embodiments, plasma grid 750 may be removed, thereby utilizing a chamber space made of sub-chambers 702 and 703. A chuck 717 is positioned within the lower sub-chamber 703 near the bottom inner surface. The chuck 717 is configured to receive and hold a semiconductor wafer 719 upon which the etching and deposition processes are performed. The chuck 717 can be an electrostatic chuck for supporting the wafer 719 when present. In some embodiments, an edge ring (not shown) surrounds chuck 717, and has an upper surface that is approximately planar with a top surface of a wafer 719, when present over chuck 717. The chuck 717 also includes electrostatic electrodes for chucking and dechucking the wafer. A filter and DC clamp power supply (not shown) may be provided for this purpose. Other control systems for lifting the wafer 719 off the chuck 717 can also be provided. The chuck 717 can be electrically charged using an RF power supply 723. The RF power supply 723 is connected to matching circuitry 721 through a connection 727. The matching circuitry 721 is connected to the chuck 717 through a connection 725. In this manner, the RF power supply 723 is connected to the chuck 717.

Elements for plasma generation include a coil 733 is positioned above window 711. In some embodiments, a coil is not used in disclosed embodiments. The coil 733 is fabricated from an electrically conductive material and includes at least one complete turn. The example of a coil 733 shown in FIG. 7 includes three turns. The cross-sections of coil 733 are shown with symbols, and coils having an "X" extend rotationally into the page, while coils having a "●" extend rotationally out of the page. Elements for plasma generation also include an RF power supply 741 configured to supply RF power to the coil 733. In general, the RF power supply 741 is connected to matching circuitry 739 through a connection 745. The matching circuitry 739 is connected to the coil 733 through a connection 743. In this manner, the RF power supply 741 is connected to the coil 733. An optional Faraday shield 749 is positioned between the coil 733 and the window 711. The Faraday shield 749 is maintained in a spaced apart relationship relative to the coil 733. The Faraday shield 749 is disposed immediately above the window 711. The coil 733, the Faraday shield 749, and the window 711 are each configured to be substantially parallel to one another. The Faraday shield may prevent metal or other species from depositing on the dielectric window of the plasma chamber 701.

Process gases (e.g. chlorine, argon, oxygen, etc.) may be flowed into the processing chamber 701 through one or more main gas flow inlets 760 positioned in the upper chamber 702 and/or through one or more side gas flow inlets 770. Likewise, though not explicitly shown, similar gas flow inlets may be used to supply process gases to a capacitively coupled plasma processing chamber. A vacuum pump, e.g., a one or two stage mechanical dry pump and/or turbomolecular pump 740, may be used to draw process gases out of the process chamber 701 and to maintain a pressure within the process chamber 701. For example, the pump may be used to evacuate the chamber 701 during a purge operation of ALE. A valve-controlled conduit may be used to fluidically connect the vacuum pump to the processing chamber 701 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 760 and/or 770. In certain embodiments, process gas may be supplied only through the main gas flow inlet 760, or only through the side gas flow inlet 770. In some cases, the gas flow inlets shown in the figure may be replaced more complex gas flow inlets, one or more showerheads, for example. The Faraday shield 749 and/or optional grid 750 may include internal channels and holes that allow delivery of process gases to the chamber 701. Either or both of Faraday shield 749 and optional grid 750 may serve as a showerhead for delivery of process gases. In some embodiments, a liquid vaporization and delivery system may be situated upstream of the chamber 701, such that once a liquid reactant or precursor is vaporized, the vaporized reactant or precursor is introduced into the chamber 701 via a gas flow inlet 760 and/or 770. Example liquid precursors include $SiCl_4$ and silicon amides.

Radio frequency power is supplied from the RF power supply 741 to the coil 733 to cause an RF current to flow through the coil 733. The RF current flowing through the coil 733 generates an electromagnetic field about the coil 733. The electromagnetic field generates an inductive current within the upper sub-chamber 702. The physical and chemical interactions of various generated ions and radicals with the wafer 719 selectively etch features of and deposit layers on the wafer.

If the plasma grid is used such that there is both an upper sub-chamber 702 and a lower sub-chamber 703, the inductive current acts on the gas present in the upper sub-chamber 702 to generate an electron-ion plasma in the upper sub-chamber 702. The optional internal plasma grid 750 limits the amount of hot electrons in the lower sub-chamber 703. In some embodiments, the apparatus is designed and operated such that the plasma present in the lower sub-chamber 703 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 703 through port 722. The chuck 717 disclosed herein may operate at temperatures ranging between about −200° C. and about 600° C. or between about −20° C. and about 250° C. for processing a substrate to etch tantalum, the chuck 717 may be set at a temperature less than about 0° C. The temperature will depend on the process operation and specific recipe and the tool used.

Chamber 701 may be coupled to facilities (not shown) when installed in a clean room or a fabrication facility. Facilities include plumbing that provide processing gases, vacuum, temperature control, and environmental particle control. These facilities are coupled to chamber 701, when installed in the target fabrication facility. Additionally, chamber 701 may be coupled to a transfer chamber that allows robotics to transfer semiconductor wafers into and out of chamber 701 using typical automation.

In some embodiments, a system controller 730 (which may include one or more physical or logical controllers) controls some or all of the operations of a processing chamber. The system controller 730 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 730 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 730, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 730 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. In some embodiments, controller 730 may be used to determine a window for temperature for the modification operation of ALE, or to determine a window for process conditions for the removal operation of ALE, or both.

The controller 730, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 730 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 730 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 8:
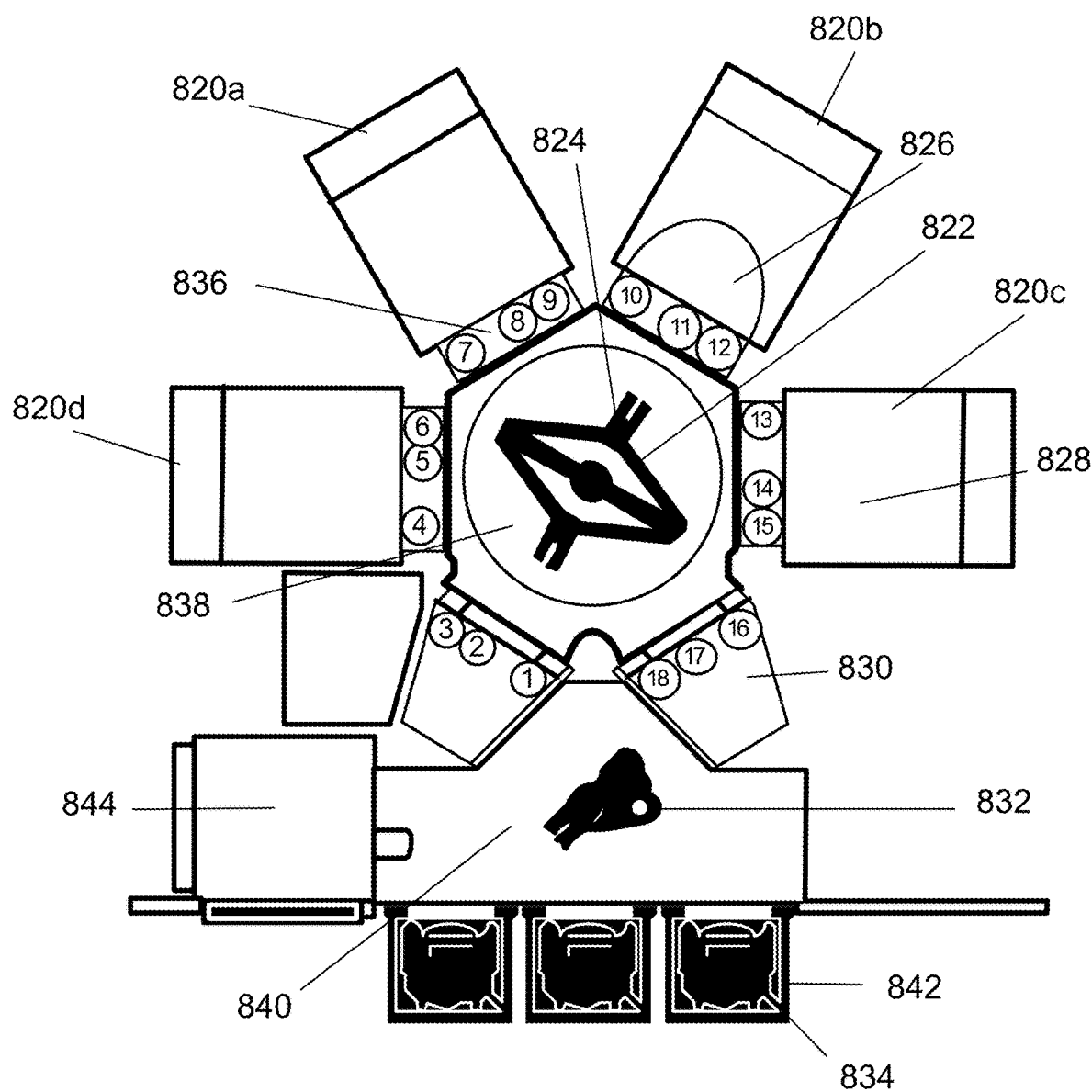
FIG. 8 is a schematic diagram of an example process apparatus for performing disclosed embodiments.

FIG. 8 depicts a semiconductor process cluster architecture with various modules that interface with a vacuum transfer module 838 (VTM). The arrangement of transfer modules to "transfer" wafers among multiple storage facilities and processing modules may be referred to as a "cluster tool architecture" system. Airlock 830, also known as a loadlock or transfer module, is shown in VTM 838 with four processing modules 820a-820d, which may be individual optimized to perform various fabrication processes. By way of example, processing modules 820a-820d may be implemented to perform substrate etching, deposition, ion implantation, wafer cleaning, sputtering, and/or other semiconductor processes. One or more of the substrate etching processing modules (any of 820a-820d) may be implemented as disclosed herein, i.e., for introducing a modification gas, for introducing a removal gas, and other suitable functions in accordance with the disclosed embodiments. Airlock 830 and process module 820 may be referred to as "stations." Each station has a facet 836 that interfaces the station to VTM 838. Inside each facet, sensors 1-18 are used to detect the passing of wafer 826 when moved between respective stations.

Robot 822 transfers wafer 826 between stations. In one embodiment, robot 822 has one arm, and in another embodiment, robot 822 has two arms, where each arm has an end effector 824 to pick wafers such as wafer 826 for transport. Front-end robot 832, in atmospheric transfer module (ATM) 840, is used to transfer wafers 826 from cassette or Front Opening Unified Pod (FOUP) 834 in Load Port Module (LPM) 842 to airlock 830. Module center 828 inside process module 820 is one location for placing wafer 826. Aligner 844 in ATM 840 is used to align wafers.

In an exemplary processing method, a wafer is placed in one of the FOUPs 834 in the LPM 842. Front-end robot 832 transfers the wafer from the FOUP 834 to an aligner 844, which allows the wafer 826 to be properly centered before it is etched or processed. After being aligned, the wafer 826 is moved by the front-end robot 832 into an airlock 830. Because airlock modules have the ability to match the environment between an ATM and a VTM, the wafer 826 is able to move between the two pressure environments without being damaged. From the airlock module 830, the wafer 826 is moved by robot 822 through VTM 838 and into one of the process modules 820a-320d. In order to achieve this wafer movement, the robot 822 uses end effectors 824 on each of its arms. Once the wafer 826 has been processed, it is moved by robot 822 from the process modules 820a-820d to an airlock module 830. From here, the wafer 826 may be moved by the front-end robot 832 to one of the FOUPs 834 or to the aligner 844.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 7 may be implemented with the tool in FIG. 8.

EXPERIMENTAL

Figure 9A:
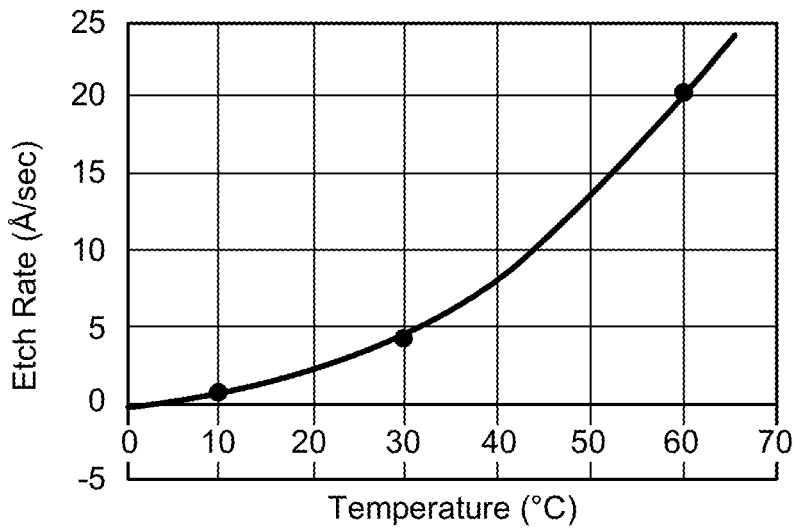
FIG. 9A is a graph of etch rate for tantalum shown as a function of temperature as determined by experimental data.
Figure 9B:
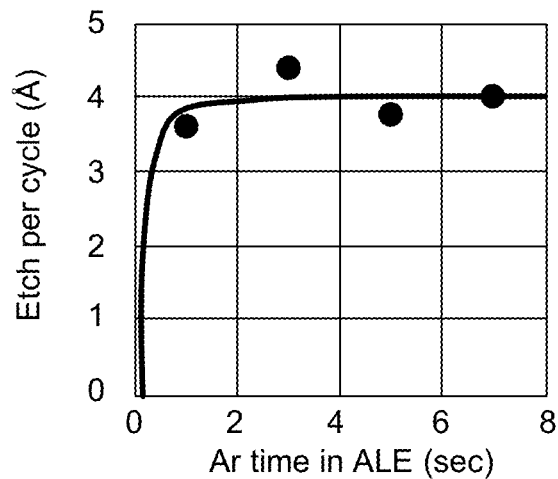
FIG. 9B is a graph of etch per cycle and duration of exposures to argon for tantalum using atomic layer etch in accordance with an experiment conducted.
Figure 9C:
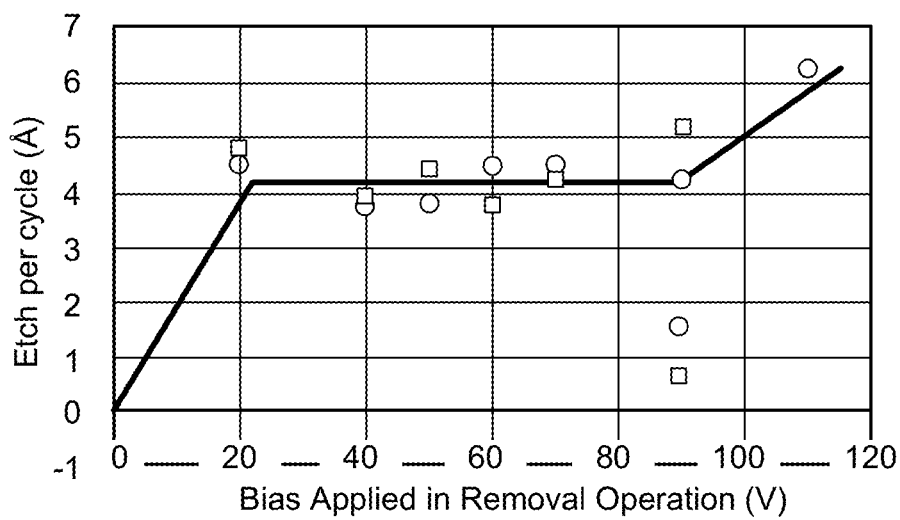
FIG. 9C is a graph of etch per cycle and bias power applied to the pedestal during removal using argon for tantalum by atomic layer etch in accordance with an experiment conducted.

FIGS. 9A-9C shows an example of designer ALE. FIG. 9A shows operation A (modification) as a function of temperature, confirming that the reaction at 0° C. can be suppressed. At this setpoint substrate temperature, FIG. 9C shows bias scan based on two experiments, both involving chlorine for modification and argon for removal in designer ALE. The circle plots represent data collected for 40 cycles of ALE. The square plots represent data collected for 25 cycles of ALE. The window is confirmed to be ~20-90 eV. This 70 eV window is the largest observed here, as compared to the germanium ALE window being 10 eV in width and the case study silicon ALE window is 20 eV in width. FIG. 9B further confirms self-limiting behavior in time. Overall, synergy is greater than about 94% but may be limited by ellipsometry error. Overall, this material showed high synergy ALE behavior. This was surprising given that tantalum reacted too quickly in an uncontrollable etching fashion at temperatures about 60° C. but after calculating the synergy and relative energy values, performing ALE of tantalum at about or less than about 0° C. as the tool allows (such as between −200° C. and about 0° C.) resulted in self-limiting etching.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching a material on a substrate, the method comprising:
   identifying process conditions for an atomic layer etching process of the material using a modification gas and a removal gas; and
   performing the atomic layer etching process on the material on the substrate by:
      exposing the substrate to the modification gas to modify a surface of the material, the modification gas having a modification energy and a desorption energy with respect to the material to be etched, and
      exposing the modified surface to the removal gas and igniting a plasma to remove the modified surface,
   wherein the modification energy is less than the desorption energy, and the desorption energy is less than a surface binding energy of the material;
   wherein the identifying the process conditions comprises selecting a substrate temperature for performing the exposing the substrate to the modification gas, wherein an ion energy provided by the substrate temperature is between the modification energy and the desorption energy;
   wherein the material has a surface binding energy greater than about 6 eV; and further comprising setting the substrate at a temperature to provide an ion energy between the modification energy and the desorption energy prior to performing the atomic layer etching process.

2. The method of claim 1, wherein the identifying the process conditions further comprises selecting a bias power for applying a bias during the exposing the modified surface to the removal gas, wherein an ion energy provided by the bias is between the desorption energy and the surface binding energy.

3. The method of claim 1, wherein the modification gas is selected to adsorb to the material without etching the material.

4. The method of claim 1, wherein the removal gas is selected to remove the modified surface without etching an underlying unmodified material.

5. The method of claim 1, wherein the process conditions further comprise those selected from the group consisting of chamber pressure, plasma power, bias power, modification gas flow, and exposure time.

6. The method of claim 1, further comprising modifying the process conditions within a process window.

7. The method of claim 1, wherein the material is selected from the group consisting of silicon, carbon, niobium, molybdenum, ruthenium, rhodium, rhenium, osmium, tungsten, and tantalum.

8. The method of claim 1, wherein the modification gas is a halogen-containing gas.

9. The method of claim 1, wherein the removal gas is an inert gas.

10. The method of claim 1, wherein the atomic layer etching process further comprises purging a chamber housing the substrate between the exposing the substrate to the modification gas and the exposing the modified surface to the removal gas.

11. The method of claim 1, wherein the setting the substrate at the temperature between the modification energy and the desorption energy comprises cooling the substrate to a low temperature.

\* \* \* \* \*